United States Patent
Mazotti et al.

(10) Patent No.: US 10,705,159 B2
(45) Date of Patent: Jul. 7, 2020

(54) HIGHLY SENSITIVE, LOW POWER FLUXGATE MAGNETIC SENSOR INTEGRATED ONTO SEMICONDUCTOR PROCESS TECHNOLOGIES

(71) Applicant: TEXAS INSTRUMENTS INCORPORATED, Dallas, TX (US)

(72) Inventors: Erika Lynn Mazotti, San Martin, CA (US); Dok Won Lee, Mountain View, CA (US); William David French, San Jose, CA (US); Byron J R Shulver, Kilmacolm (GB); Thomas Dyer Bonifield, Dallas, TX (US); Ricky Alan Jackson, Richardson, TX (US); Neil Gibson, Largs (GB)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/502,317

(22) Filed: Jul. 3, 2019

(65) Prior Publication Data
US 2019/0324097 A1 Oct. 24, 2019

Related U.S. Application Data

(63) Continuation of application No. 15/169,639, filed on May 31, 2016, now Pat. No. 10,345,397.

(51) Int. Cl.
*G01R 33/04* (2006.01)
*G01R 33/00* (2006.01)

(52) U.S. Cl.
CPC ......... *G01R 33/04* (2013.01); *G01R 33/0052* (2013.01)

(58) Field of Classification Search
CPC ............................. G01R 33/04; G01R 33/0052
See application file for complete search history.

(56) References Cited

U.S. PATENT DOCUMENTS

| 4,759,118 A | 7/1988 | Nakashima |
| 7,498,921 B1 | 3/2009 | Wang |

(Continued)

FOREIGN PATENT DOCUMENTS

| EP | 0604809 A2 | 7/1994 |
| SU | 892357 A | 12/1981 |

OTHER PUBLICATIONS

Dezuari O. et al. Printed circuit board integrated fluxgate sensor. Sensor and Actuators. 81 (2000) 200-203.

(Continued)

*Primary Examiner* — Alvaro E Fortich
*Assistant Examiner* — Zannatul Ferdous
(74) *Attorney, Agent, or Firm* — Andrew R. Ralston; Charles A. Brill; Frank D. Cimino

(57) ABSTRACT

An integrated fluxgate device has a magnetic core disposed over a semiconductor substrate. A first winding is disposed in a first metallization level above and a second metallization level below the magnetic core, and is configured to generate a first magnetic field in the magnetic core. A second winding is disposed in the first and second metallization levels and is configured to generate a second magnetic field in the magnetic core. A third winding is disposed in the first and second metallization levels and is configured to sense a magnetic field in the magnetic core that is the net of the first and second magnetic fields.

20 Claims, 32 Drawing Sheets

(56) References Cited

U.S. PATENT DOCUMENTS

| | | |
|---|---|---|
| 2004/0235296 A1 | 11/2004 | Bailey et al. |
| 2006/0192181 A1 | 8/2006 | Fraisse et al. |
| 2009/0001968 A1* | 1/2009 | Krammer ............. G01D 5/2006 324/207.15 |
| 2011/0149473 A1 | 6/2011 | Eilertsen et al. |
| 2012/0133475 A1 | 5/2012 | Visser et al. |
| 2012/0314332 A1 | 12/2012 | Fries et al. |
| 2013/0038322 A1* | 2/2013 | Yamamoto ............. G01N 27/80 324/239 |
| 2013/0207651 A1* | 8/2013 | Ruckert ............. G01R 33/0213 324/258 |
| 2015/0048818 A1 | 2/2015 | Schaffer et al. |
| 2015/0255203 A1 | 9/2015 | Herzer et al. |
| 2016/0172434 A1 | 6/2016 | West et al. |
| 2016/0334473 A1 | 11/2016 | Snoeij et al. |

OTHER PUBLICATIONS

DRV421 Integrated Fluxgate Sensor for Closed-Loop Current Sensing. Texas Instruments. May 2015.

Notification of Transmittal of the International Search Report and the Written Opinion of the International Searching Authority, or the Daclaration.

\* cited by examiner

HIGHLY SENSITIVE, LOW POWER FLUXGATE MAGNETIC SENSOR INTEGRATED ONTO SEMICONDUCTOR PROCESS TECHNOLOGIES

CROSS REFERENCE TO RELATED APPLICATIONS

This application is a continuation of U.S. patent application Ser. No. 15/169,639, filed May 31, 2016, issued as U.S. Pat. No. 10,345,397, the content of which is herein incorporated by reference in its entirety.

FIELD

This disclosure relates to the field of fluxgate devices. More particularly, this disclosure relates to integrated fluxgate devices.

BACKGROUND

Integrated fluxgate devices are fluxgate magnetometers formed onto semiconductor devices, providing a magnetic sensing device in a small volume at a low cost compared to conventional macroscopic magnetometers made of discrete components. Integrated fluxgate devices enable new applications, such as a handheld electronic compass, which requires performance providing a resolution of about 50 microtesla, for example with a noise bandwidth of about 50 kilohertz (kHz), or equivalent. Resolution may be understood as the minimum detectable change in an external magnetic field. The noise bandwidth is affected by the frequency spectrum of current through windings of the magnetometer, which also affects the signal magnitude. Additional applications, such as proximity current sensing for motor control, could be enabled by a low power integrated fluxgate device having performance providing a resolution significantly less than 50 microtesla. It is furthermore desirable to attain low non-linearity over a usable range of magnetic fields, for example a range of millitesla, measurable by the magnetometer. Achieving that level of performance in an integrated fluxgate device has proven problematic, due to several interacting design and fabrication constraints. A larger magnetic core is required for a more sensitive magnetometer, but larger cores have increased mechanical stress which causes structural defects leading to increased magnetic noise, including Barkhausen noise. A larger magnetic core also requires higher currents in windings around the core, confounding the requirement for low power consumption.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated fluxgate device has a magnetic core including two core segments of magnetic material disposed in dielectric layers over a control circuit. Each core segment has a volume and internal structure sufficient to have low magnetic noise and low non-linearity during transitions between magnetic saturations of opposite polarity, and so to provide high resolution performance. A stress control structure is disposed around the magnetic core. An excitation winding is coiled around the magnetic core, configured to carry sufficient current to provide a saturation magnetic field in each core segment, at high frequency, and with a low voltage across the excitation winding. A sense winding is coiled around the magnetic core configured to provide a signal corresponding to a change in magnetization in each core segment, at the high frequency, to a sense circuit disposed in the control circuit. A compensation winding is coiled around the magnetic core, configured to carry sufficient current to provide a compensating magnetic field in each core segment. An isolation structure is disposed between the magnetic core and the windings, sufficient to enable operation of the excitation winding and the sense winding at the high frequency at low power.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A highly sensitive, low power integrated fluxgate device has a magnetic core including two parallel core segments of magnetic material disposed in dielectric layers over a control circuit. Each core segment has a volume and internal structure sufficient to have low magnetic noise and low non-linearity during transitions between magnetic saturation of opposite polarity. A stress control structure is disposed proximate to, for example above and below, the magnetic core. An excitation winding is coiled around the magnetic core, configured to carry sufficient current to provide a saturation magnetic field in the magnetic core, at high frequency, and with a low voltage across the excitation winding. A sense winding is coiled around the magnetic core configured to provide a signal corresponding to a change in a magnetic field in each core segment, at the high frequency, to a sense circuit disposed in the control circuit. A compensation winding is coiled around the magnetic core, configured to carry sufficient current to provide a compensating magnetic field in each core segment. An isolation structure is disposed above and below the magnetic core, sufficient to enable operation of the excitation winding and the sense winding at the high frequency at low power. The integrated flux magnetometer may be capable of a 10 microtesla resolution, for example with a 100 kHz noise bandwidth, or equivalent performance in a higher or lower noise bandwidth. The integrated flux magnetometer may further be capable of a non-linearity less than 1 percent over a range from −2 millitesla to +2 millitesla.

For the purposes of this disclosure, the term "lateral" is understood to refer to a direction parallel to a plane of a top surface of the control circuit. The term "vertical" is understood to refer to a direction perpendicular to the plane of the top surface of the control circuit.

Figure 1A:
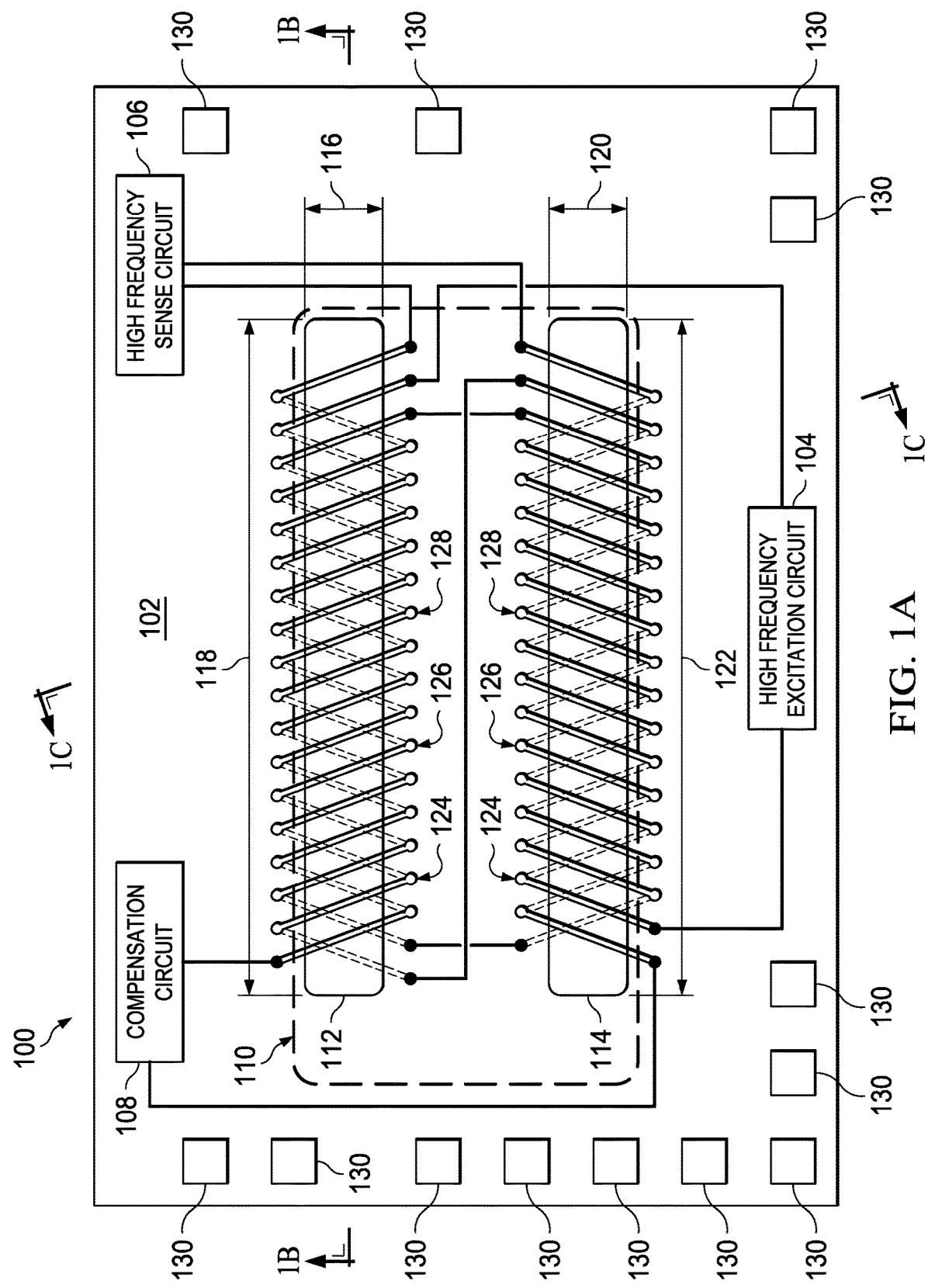
FIG. 1A through FIG. 1C are views of an example integrated fluxgate device.
Figure 1B:
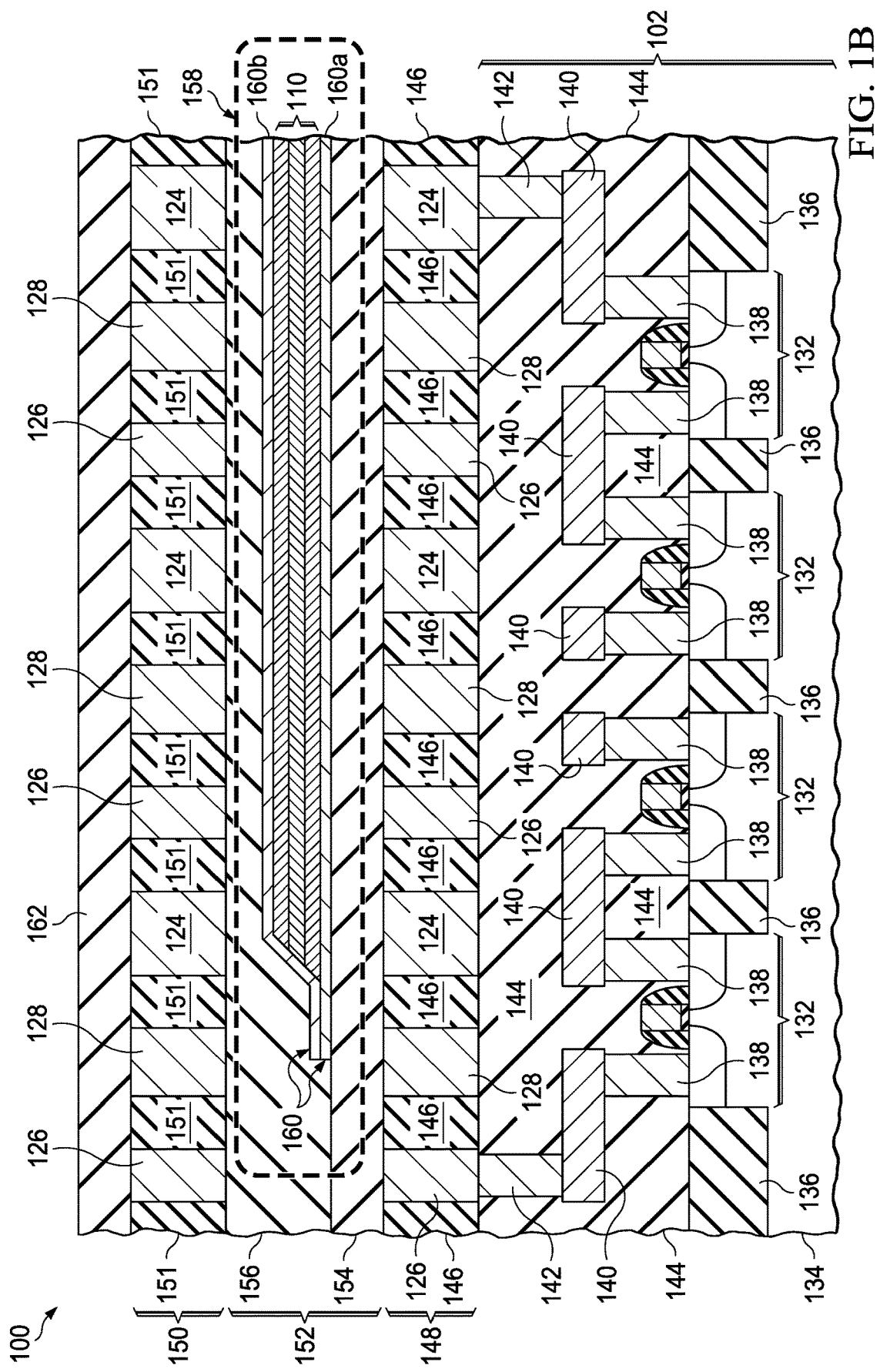
Figure 1C:
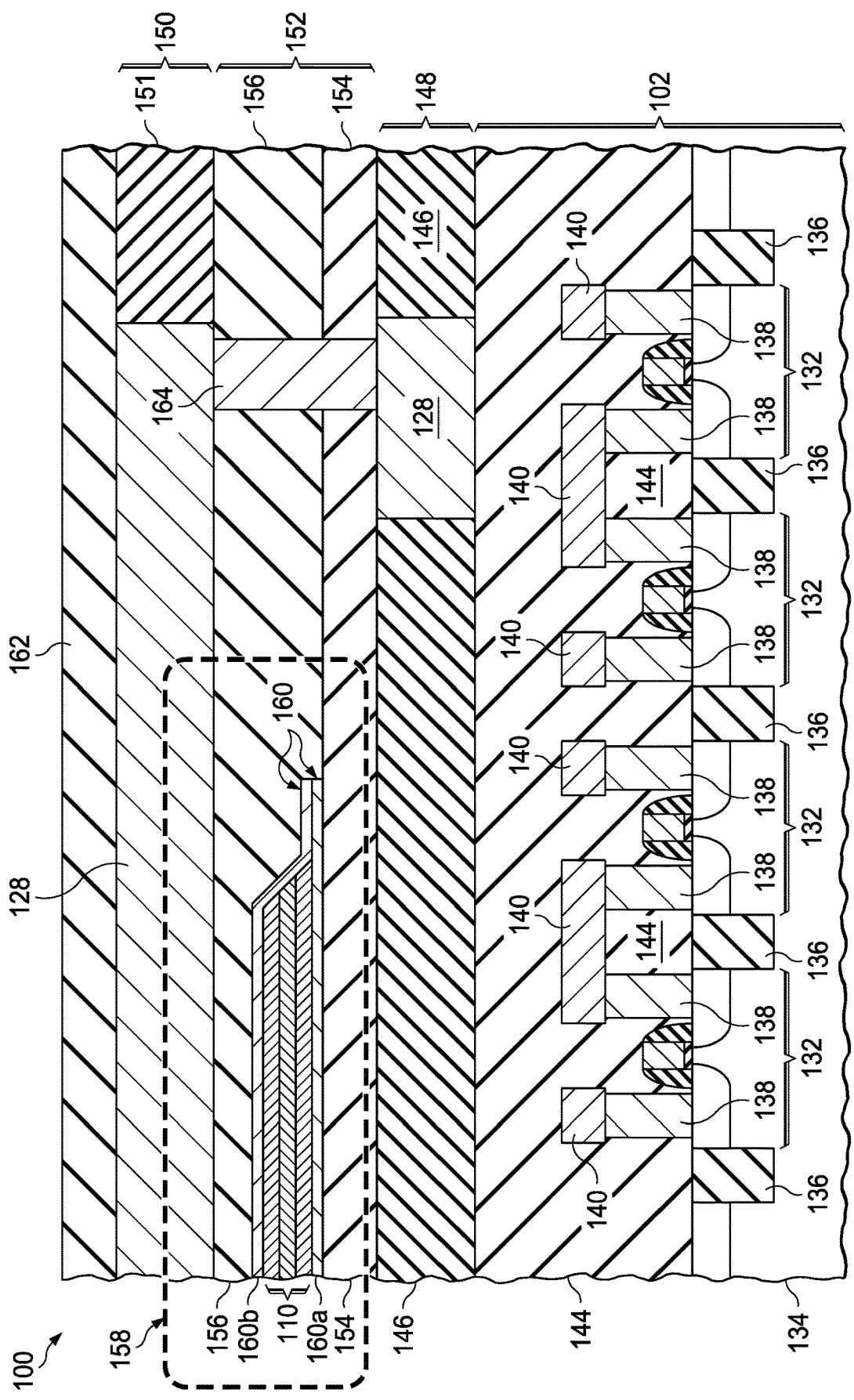

FIG. 1A through FIG. 1C are views of an example integrated fluxgate device. Referring to FIG. 1A, which is a top view, the integrated fluxgate device 100 includes a control circuit 102. The control circuit 102 includes an excitation circuit 104, a sense circuit 106 and a compensation circuit 108. The integrated fluxgate device 100 includes a magnetic core 110. In the instant example, the magnetic core 110 comprises a first core segment 112 and a second core segment 114. The first core segment 112 may have a width 116 greater than 50 microns, for example, and a length 118 at least 3 times the width 116, perpendicular to the width 116. The width 116 and length 118 of the first core segment 112 are substantially parallel to a top surface of a semiconductor substrate of the control circuit 102. The second core segment 114 may have a width 120 substantially equal to the width 116 of the first core segment 112, and a length 122 substantially equal to the length 118 of the first core segment 112. The width 120 and length 122 of the second core segment 114 are also substantially parallel to the top surface of the semiconductor substrate of the control circuit 102. The length 118 of the first core segment 112 and the length 122 of the second core segment 114 may be oriented parallel to each other, as depicted in FIG. 1A. The first core segment 112 and the second core segment 114 may be magnetized in a direction parallel to their widths 116 and 120, and perpendicular to their lengths 118 and 122, and perpendicular to the top surface of the semiconductor substrate of the control circuit 102. Magnetization of the first core segment 112 and the second core segment 114 perpendicular to their lengths 118 and 122 may advantageously facilitate operation of the excitation circuit 104 at the high frequency.

An excitation winding 124, a sense winding 126, and a compensation winding 128 are coiled around the magnetic core 110. The excitation winding 124 is configured to carry sufficient current to generate a saturation magnetic field in the magnetic core 110, at high frequency, and with a low voltage, for example less than 10 volts, across the excitation winding 124. The excitation winding 124 may have a thickness of at least 2.5 microns, for example, to carry sufficient current at high frequency and with a low voltage. The excitation winding 124 may be arranged around the magnetic core 110 so that a current through the excitation winding 124 induces a first magnetic field in the first core segment 112 substantially parallel to the length 118 in a first direction, and simultaneously induces a second magnetic field in the second core segment 114 substantially parallel to the length 122 in a second direction, opposite from, e.g., antiparallel to, the first direction.

The excitation winding 124 is coupled to the excitation circuit 104, as depicted schematically in FIG. 1A, for example through metal interconnects of the control circuit 102. The excitation circuit 104 is configured to provide current at a high frequency, for example greater than 100 kHz, to the excitation winding 124 sufficient to generate a saturating magnetic field in the magnetic core 110 during each cycle at the high frequency. Furthermore, the excitation circuit 104 may be configured to provide the current to the excitation winding 124 with a rise time that is significantly less than 15 percent of a cycle time of the high frequency, and may be independent of the cycle time. The rise time may be understood as a time delay between the current at 10 percent and the current at 90 percent of an amplitude change during a cycle at the high frequency. In one example, at a high frequency of 500 kHz, the cycle time is 2 microseconds, and the rise time may be less than 50 nanoseconds.

The sense winding 126 may be arranged around the magnetic core 110 to have a winding configuration with a same orientation as the excitation winding 124 around the first core segment 112, and an opposite orientation from the excitation winding 124 around the second core segment 114, to provide a combined voltage that is a sum of voltages generated by the first core segment 112 and the second core segment 114. The sense winding 126 may be laterally adjacent to the excitation winding 124 and may have a substantially equal thickness as the excitation winding 124.

The sense winding 126 is coupled to the sense circuit 106, as depicted schematically in FIG. 1A, for example through the metal interconnects of the control circuit 102. The sense circuit 106 is configured to provide an output signal which is a function of the combined voltage provided by the sense winding 126.

The compensation winding 128 may be arranged around the magnetic core 110 so that a current through the compensation winding 128 induces a first compensation magnetic field component in the first core segment 112 substantially parallel to the length 118 in a first direction, and simultaneously induces a second compensation magnetic field component in the second core segment 114 substantially parallel to the length 122 in the first direction, e.g., parallel to the first compensation magnetic field component. The compensation winding 128 is configured to carry sufficient current to generate a compensation magnetic field in the magnetic core 110 with a low voltage, across the compensation winding 128. The compensation winding 128 may be laterally adjacent to the excitation winding 124 and may have a substantially equal thickness as the excitation winding 124. The compensation winding 128 is coupled to the compensation circuit 108, as depicted schematically in FIG. 1A, for example through the metal interconnects of the control circuit 102. The compensation circuit 108 is configured to provide current to the compensation winding 128 sufficient to generate the compensation magnetic field in the magnetic core 110.

In an alternate manifestation of the instant example, the magnetic core 110 may have a closed loop configuration, with the first core segment 112 and the second core segment 114 being portions of the loop. In such a manifestation, the excitation winding 124 may be coiled around the entire loop. Other configurations of the magnetic core 110 are within the scope of the instant example.

The control circuit 102 includes various isolation layers and stress control layers above the semiconductor substrate and above and below the magnetic core 110 and the excitation winding 124, the sense winding 126, and the compensation winding 128. These isolation layers and stress control layers are not shown in FIG. 1A so as to more clearly depict the structure of the magnetic core 110 and the excitation winding 124, the sense winding 126, and the compensation winding 128. The isolation layers and stress control layers are depicted in FIG. 1B and FIG. 1C.

The control circuit 102 may include bond pads 130 coupled to the excitation circuit 104, the sense circuit 106, and the compensation circuit 108, possibly through the metal interconnects and possibly through additional circuits and components in the control circuit 102. In one manifestation of the instant example, the bond pads 130 may be free of magnetic material, which may advantageously reduce a confounding magnetic field in the magnetic core 110. For example, in such a manifestation, the bond pads 130 may comprise aluminum over an adhesion layer comprising titanium, and may be free of nickel.

Referring to FIG. 1B, which is a cross section of the integrated fluxgate device 100 through the first core segment 112 of FIG. 1A, the control circuit 102 includes active components 132, depicted in FIG. 1B as metal oxide semiconductor (MOS) transistors, disposed on the semiconductor substrate 134. The active components 132, possibly laterally isolated by field oxide 136, may be parts of the excitation circuit 104, the sense circuit 106, and the compensation circuit 108 of FIG. 1A. The control circuit 102 further includes metal interconnects which couple the active components 132 to each other and to the excitation winding 124, the sense winding 126, and the compensation winding 128. The metal interconnects may include contacts 138 making electrical connections to the active components 132, metal lines 140 making connections to the contacts 138, and vias 142 making connections to the metal lines 140. A dielectric layer stack 144 is disposed among the contacts 138, metal lines 140 and vias 142. The dielectric layer stack 144 may include, for example, a pre-metal dielectric (PMD) layer surrounding the contacts 138, an intra-metal dielectric (IMD) layer above the PMD layer and between the metal lines 140, and an inter-level dielectric (ILD) layer above the IMD layer and surrounding the vias 142. Each of the PMD layer, the IMD layer and the ILD layer may include sublayers such as etch stop layers and cap layers. The control circuit 102 may include additional levels of the metal lines 140 and vias 142, with corresponding additional IMD layers and ILD layers. The contacts 138 may include tungsten on a titanium-containing barrier liner with a damascene structure. The metal lines 140 may include copper on a barrier liner with a damascene structure, or may include aluminum on a titanium-containing adhesion layer with a masked-etched structure. The vias 142 may include copper on a barrier liner with a damascene structure or tungsten on a titanium-containing barrier liner with a damascene structure. Other structural configurations for the contacts 138, the metal lines 140 and the vias 142 are within the scope of the instant example.

The excitation winding 124, the sense winding 126, and the compensation winding 128 are disposed above the active components 132 and may be disposed above the contacts 138, the metal lines 140 and the vias 142. Lower segments 148 of the excitation winding 124, the sense winding 126, and the compensation winding 128 may be laterally isolated from each other by dielectric material 146 which may include several layers of different dielectric material. Similarly, upper segments 150 of the excitation winding 124, the sense winding 126, and the compensation winding 128 may be laterally isolated from each other by dielectric material 151 which may also include several layers of different dielectric material.

The excitation winding 124, the sense winding 126, and the compensation winding 128 are coiled around the magnetic core 110, and are separated from the magnetic core 110 by an isolation structure 152. The isolation structure 152 provides sufficient capacitive isolation between the magnetic core 110 and the excitation winding 124, the sense winding 126, and the compensation winding 128 to enable the excitation circuit 104 and the sense circuit 106 to operate at the high frequency with low power consumption. In the instant example, the isolation structure 152 may include a lower isolation layer 154 above the lower segments 148 of the excitation winding 124, the sense winding 126, and the compensation winding 128 and below the magnetic core 110. The isolation structure 152 may further include an upper isolation layer 156 below the upper segments 150 of the excitation winding 124, the sense winding 126, and the compensation winding 128 and above the magnetic core 110.

The magnetic core 110 comprises magnetic material, for example, layers comprising iron, nickel, molybdenum and/or cobalt, possibly with lesser amounts of boron, chromium, copper and/or silicon. The magnetic core 110 may have a layered structure, as depicted in FIG. 1B, with electrically isolating material between layers of the magnetic material, to reduce eddy currents. These magnetic materials exhibit significant compressive stress, which may lead to generation of structural defects in the magnetic core 110 if not countered.

A stress control structure 158 is disposed vertically adjacent to the magnetic core 110, that is, immediately above and/or below the magnetic core 110. The stress control structure 158 reduces formation of the structural defects in the magnetic core 110 due to stress. The structural defects may introduce pinning sites of magnetic domains in the magnetic material of the magnetic core 110, undesirably increasing magnetic noise as a magnetic field in the magnetic core 110 increases or decreases. In one version of the instant example, the stress control structure 158 may be manifested by forming the isolation structure 152 of a mechanically strong material having a stress opposite from the stress in the magnetic core 110, so as to constrain movement in the magnetic core 110, thereby reducing formation of the structural defects. In another version of the instant example, the stress control structure 158 may be manifested by forming the isolation structure 152 of compliant material which allows the magnetic core 110 to move in response to stress without generating the structural defects. The stress control structure 158 may further include an adhesion/barrier structure 160 disposed on the magnetic core 110. The adhesion/barrier structure 160 may include, for example, a lower layer 160a of titanium-containing metal immediately below the magnetic core 110 and an upper layer 160b of titanium-containing metal immediately above the magnetic core 110. The adhesion/barrier structure 160 may improve adhesion of dielectric material in the stress control structure 158 to the magnetic core 110 while providing a barrier against diffusion of transition metal from the magnetic core 110 into the dielectric material of the stress control structure 158.

A top dielectric layer 162 is disposed over the excitation winding 124, the sense winding 126, and the compensation winding 128. The top dielectric layer 162 may include more than one sub-layer of dielectric material to provide desired barriers to water vapor and chemical contaminants, as well as mechanical protection. The top dielectric layer 162 may include similar dielectric material as the dielectric material 146 between the upper segments 150 of the excitation winding 124, the sense winding 126, and the compensation winding 128.

Referring to FIG. 1C, which is a cross section across the first core segment 112 and the second core segment 114 of FIG. 1A, the lower segments 148 of the excitation winding 124, the sense winding 126, and the compensation winding 128 extend past the magnetic core 110. In FIG. 1C, the plane of the cross section cuts through the compensation winding 128; the excitation winding 124 and the sense winding 126 are out of the plane of FIG. 1C, but have similar configurations to the compensation winding 128. In the lower segments 148, the compensation winding 128 is at an angle to the plane of FIG. 1C, so that the compensation winding 128 in the lower segments 148 does not extend under the magnetic core 110 in the plane of FIG. 1C.

The isolation structure 152 may also extend past the magnetic core 110, as depicted in FIG. 1C. The isolation structure 152 may have a substantially constant thickness as indicated in FIG. 1C, or may have a lesser thickness past the magnetic core 110. Dielectric layers that comprise the stress control structure 158 may terminate proximate to a lateral boundary of the magnetic core 110, as indicated in FIG. 1C, or may possibly extend past the magnetic core 110 to proximate a lateral boundary of the control circuit 102. The upper segments 150 of the excitation winding 124, the sense winding 126, and the compensation winding 128 also extend past the magnetic core 110. Each upper segment 150 of the excitation winding 124, the sense winding 126, and the compensation winding 128 is coupled to a corresponding lower segment 148 of the respective excitation winding 124, sense winding 126 and compensation winding 128 by a winding via 164 which extends through the isolation structure 152. The winding vias 164 may have any of various structures, for example a damascene structure with a barrier liner and copper fill metal, or a masked-plated structure with a seed layer and copper fill metal.

Figure 2A:
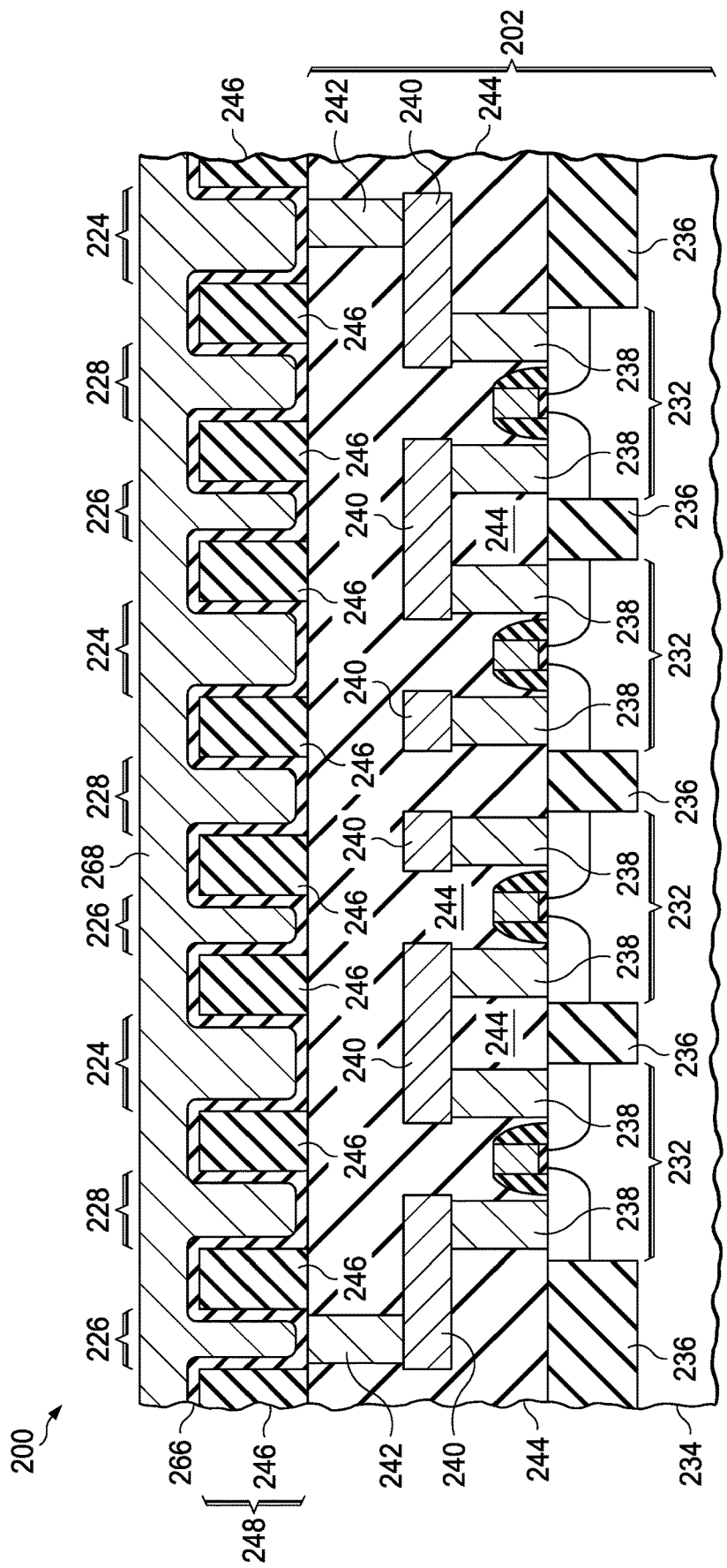
FIG. 2A through FIG. 2N are cross sections of an integrated fluxgate device, depicting an exemplary method of formation.
Figure 2B:
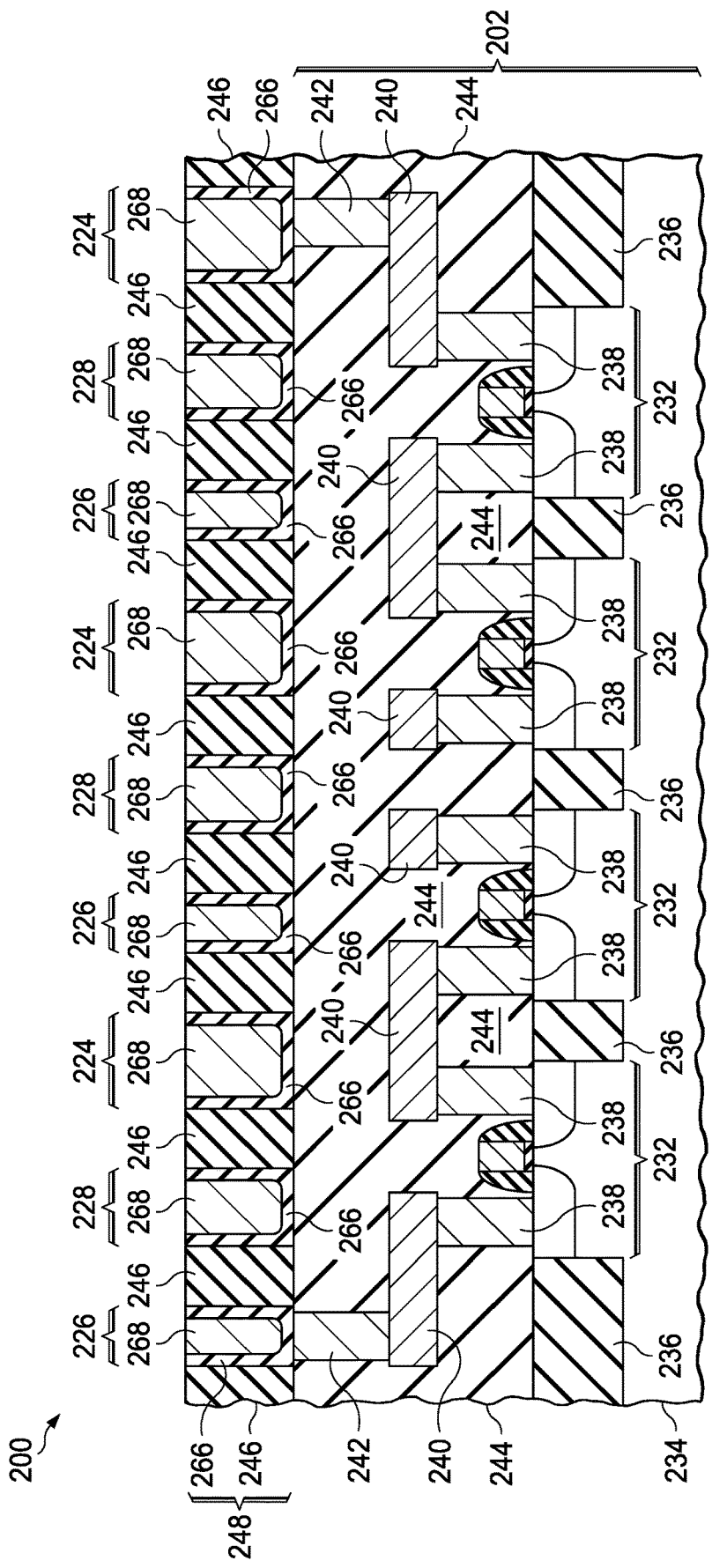
Figure 2C:
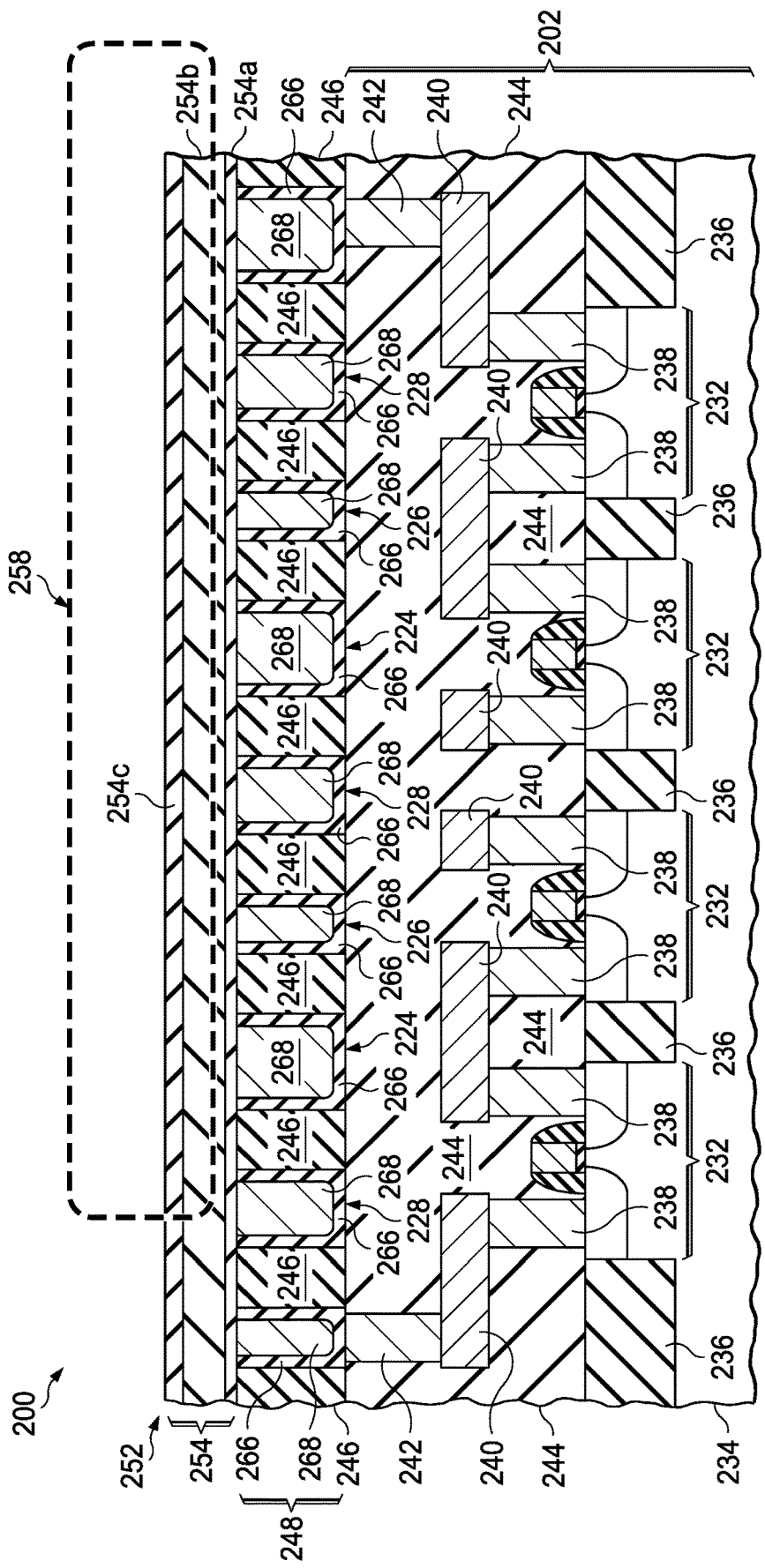
Figure 2D:
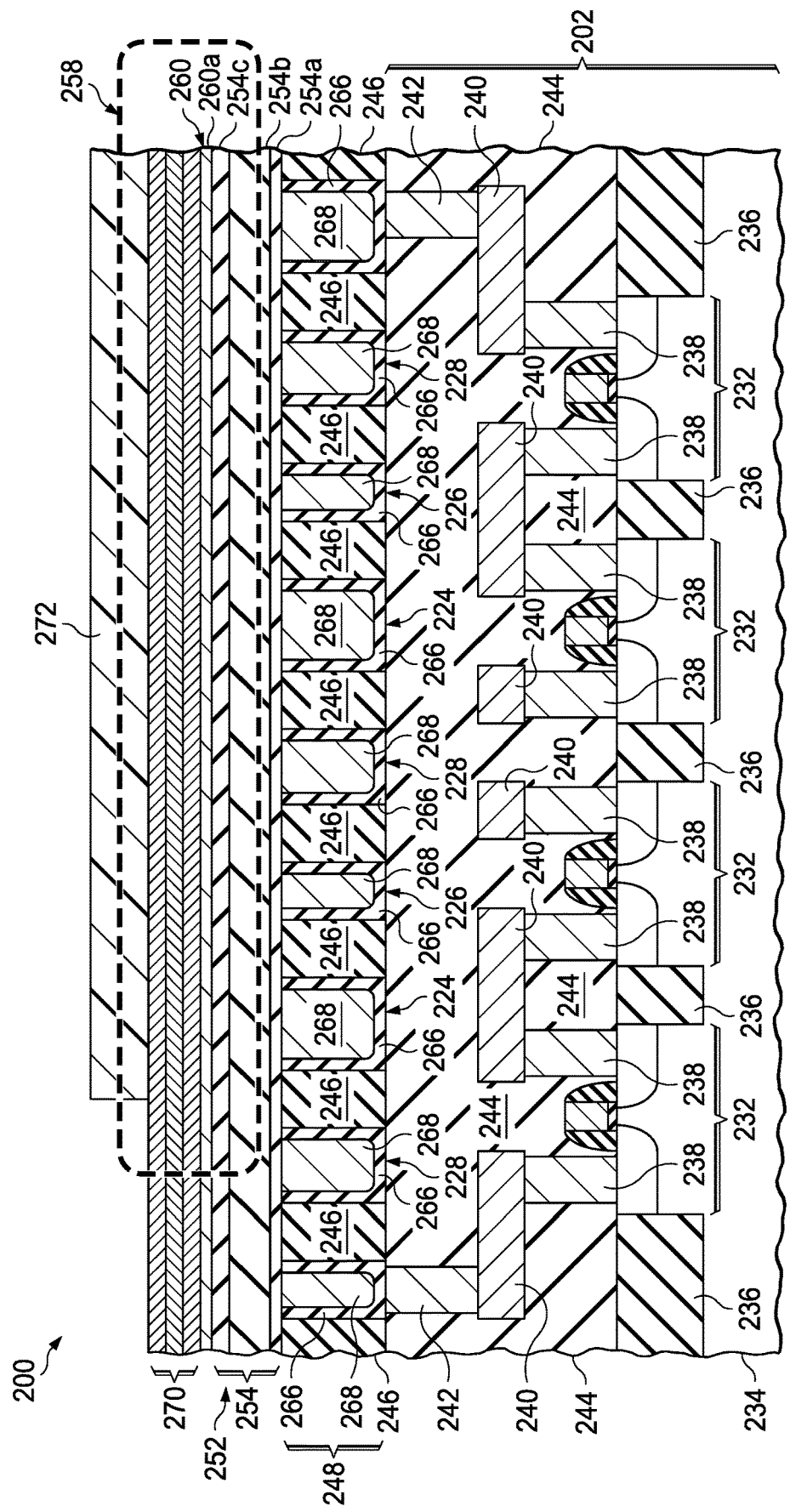
Figure 2E:
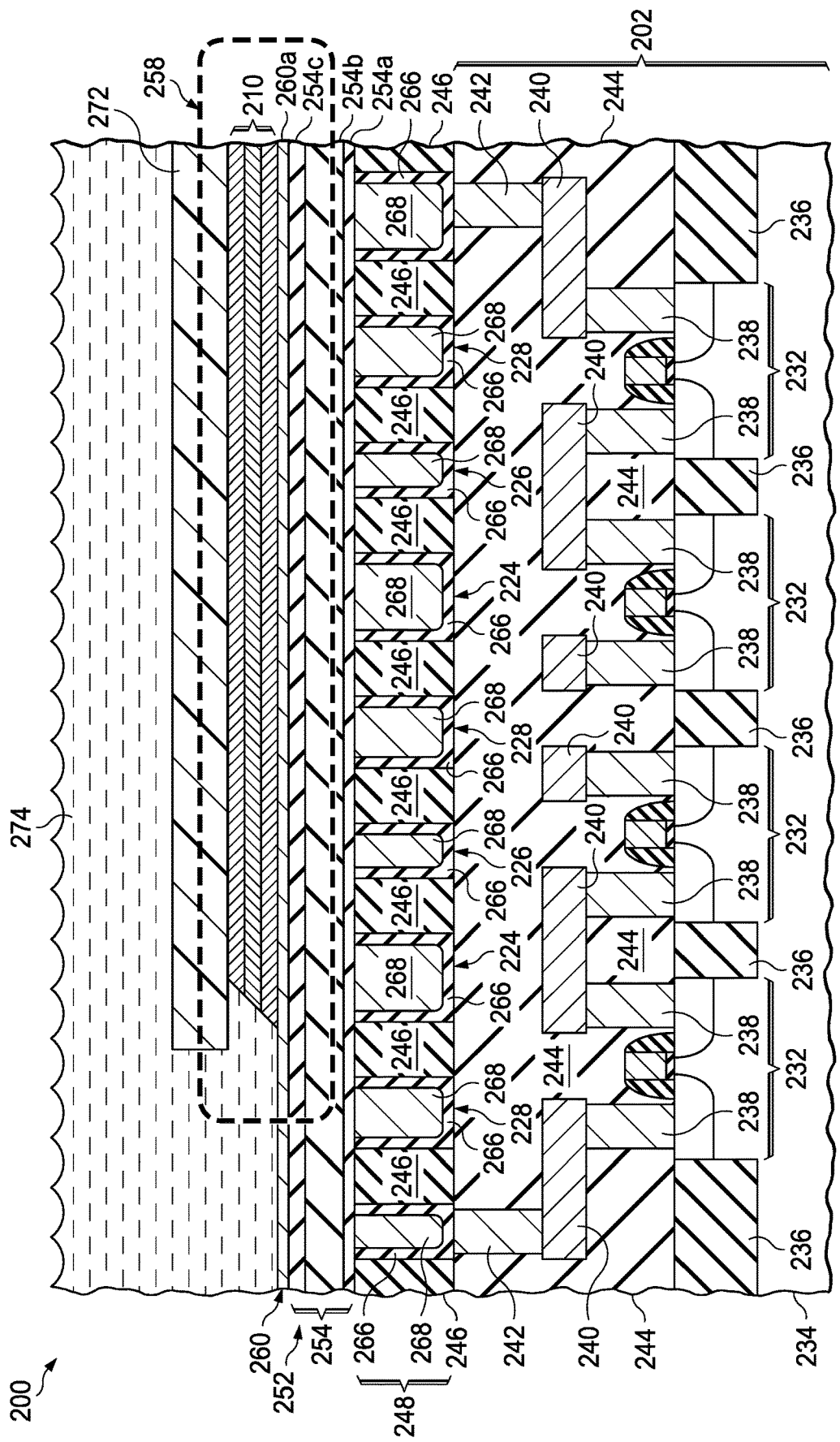
Figure 2F:
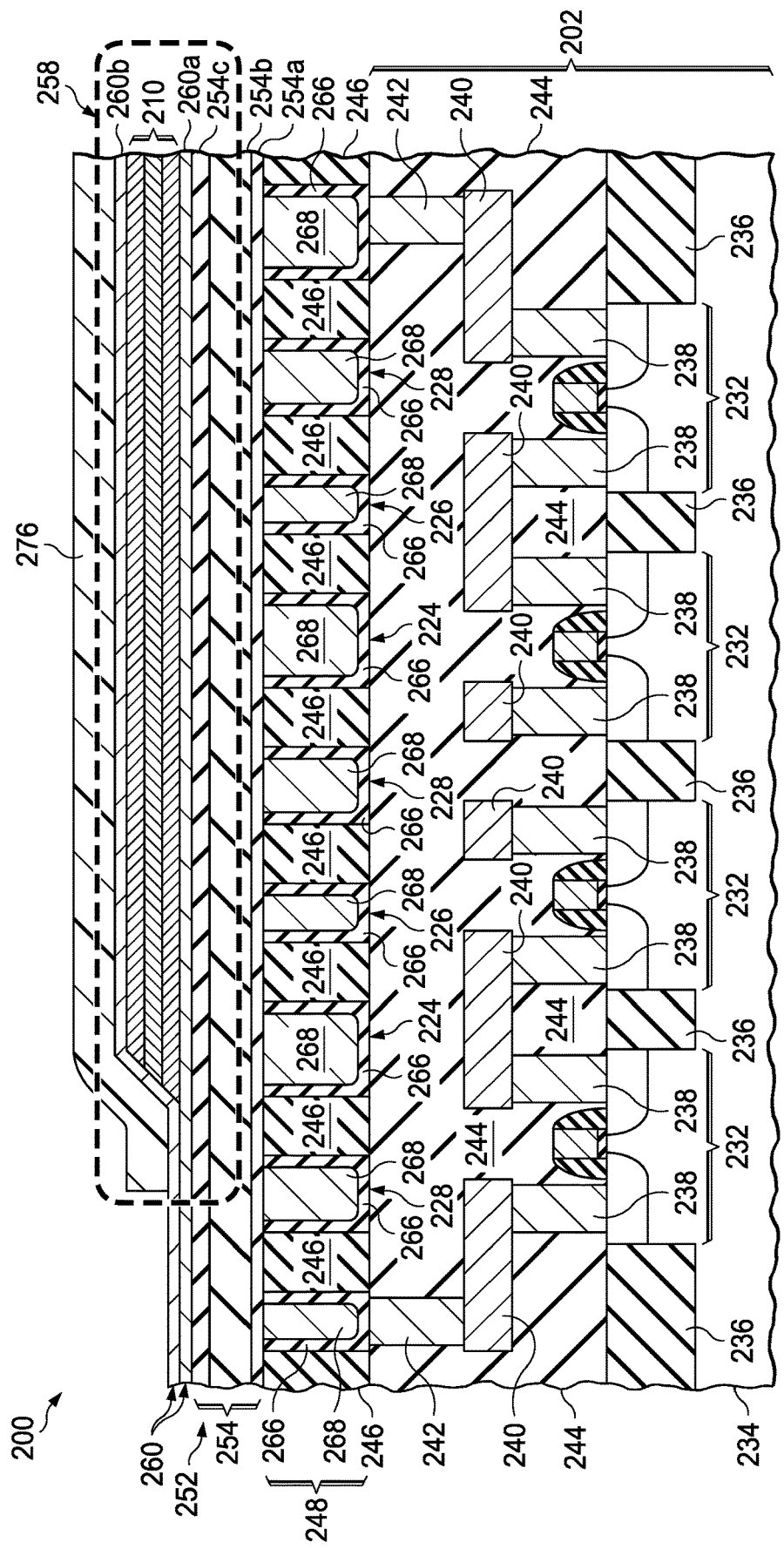
Figure 2G:
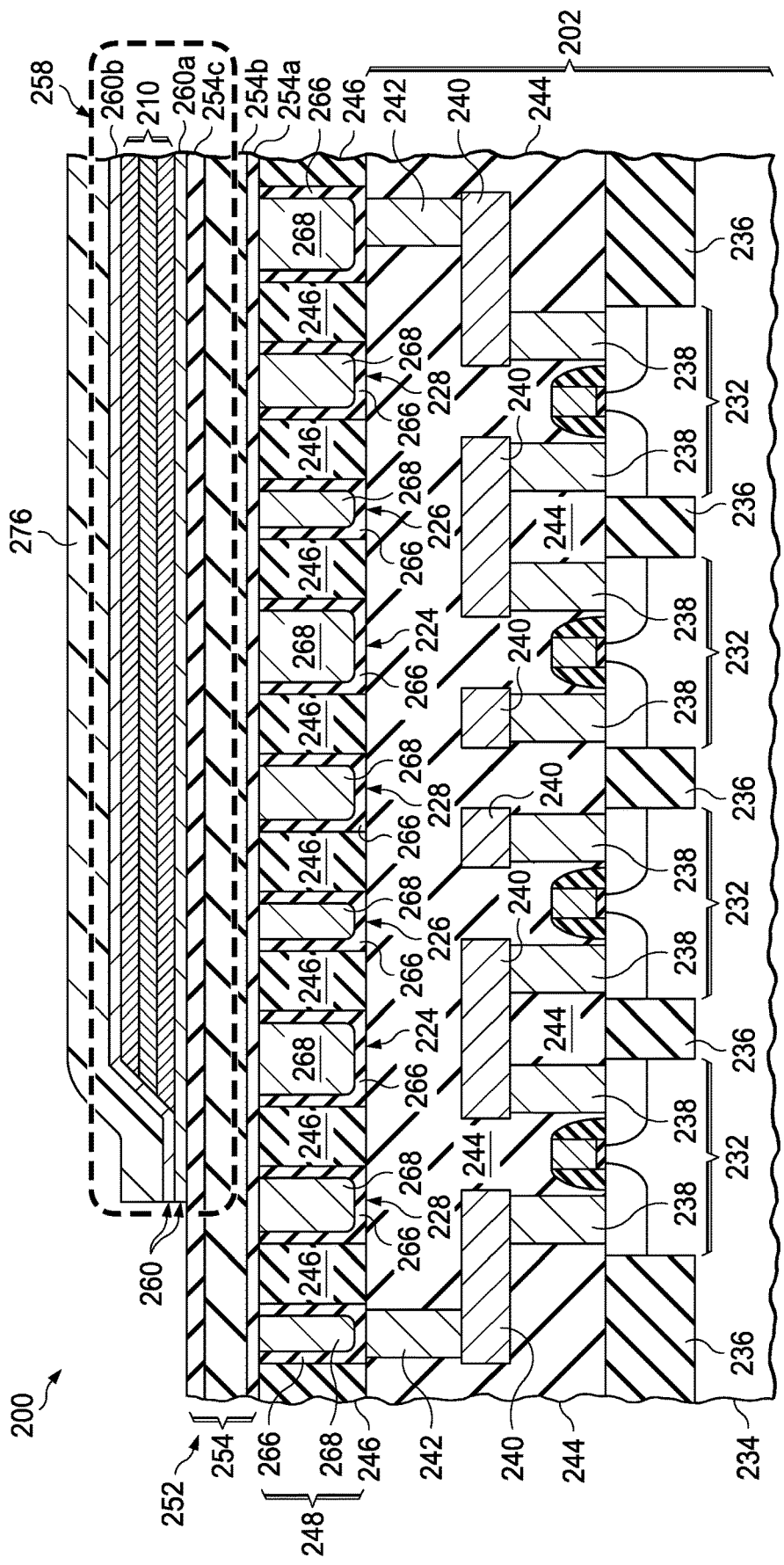
Figure 2H:
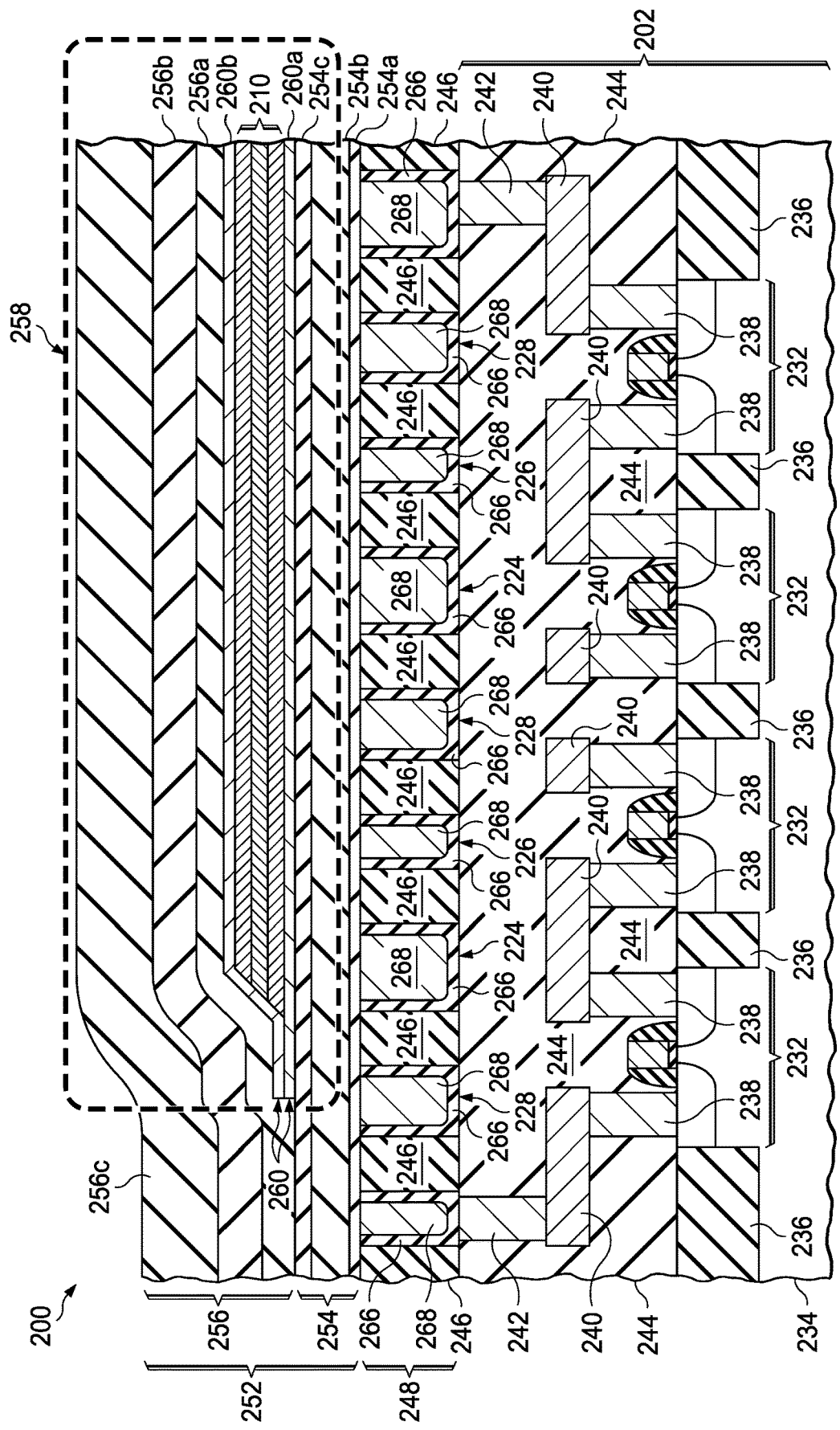
Figure 2I:
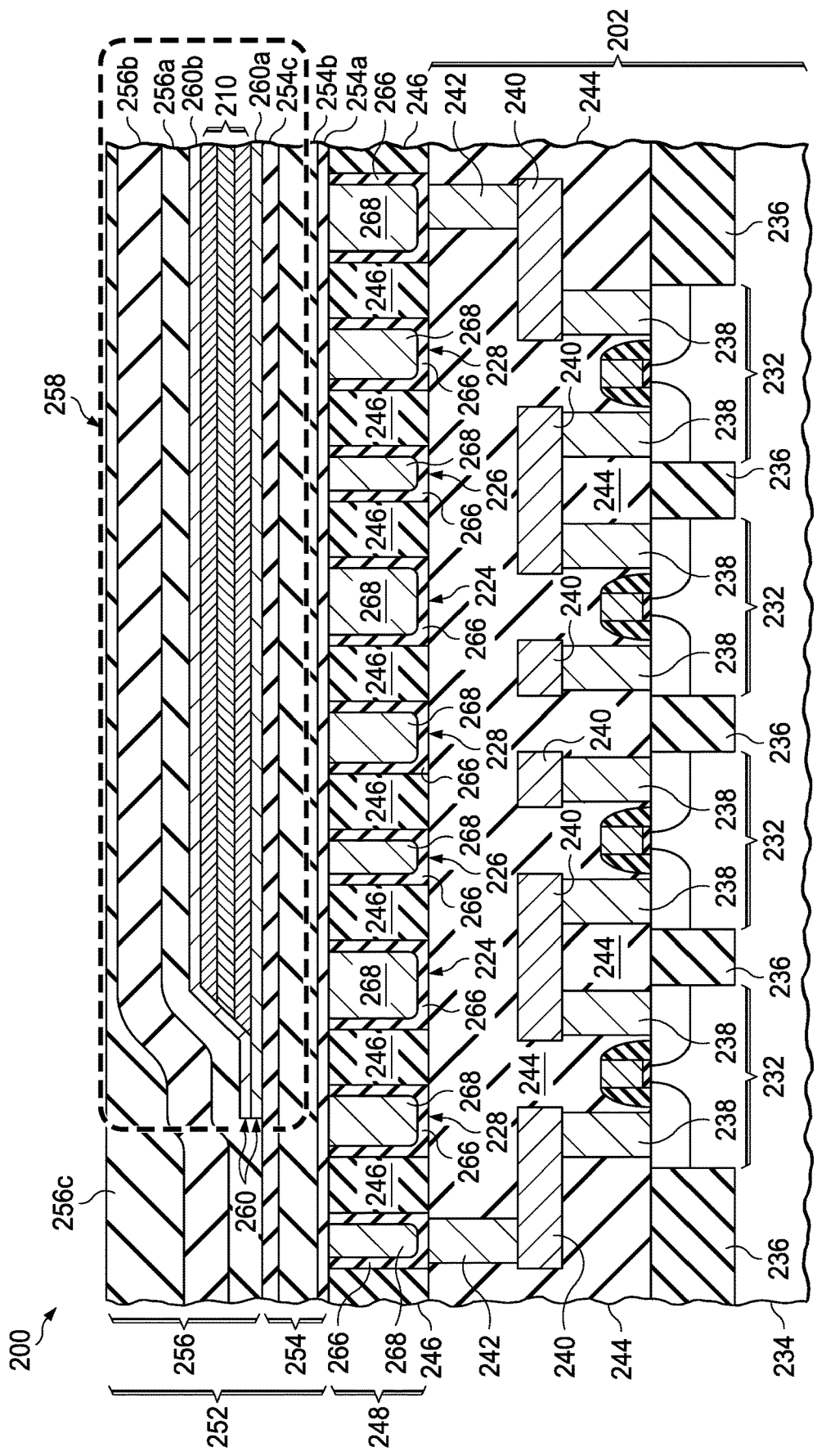
Figure 2J:
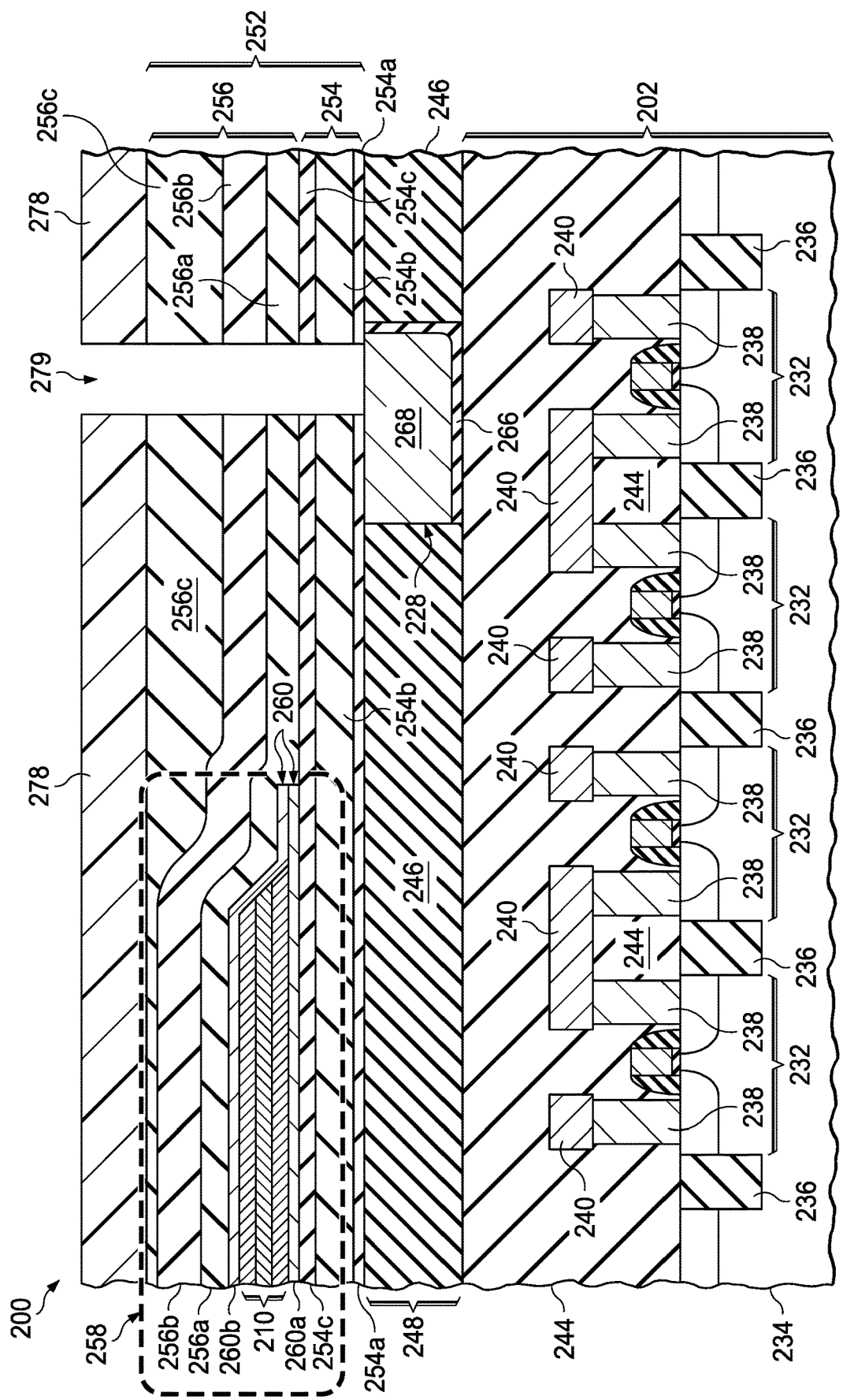
Figure 2K:
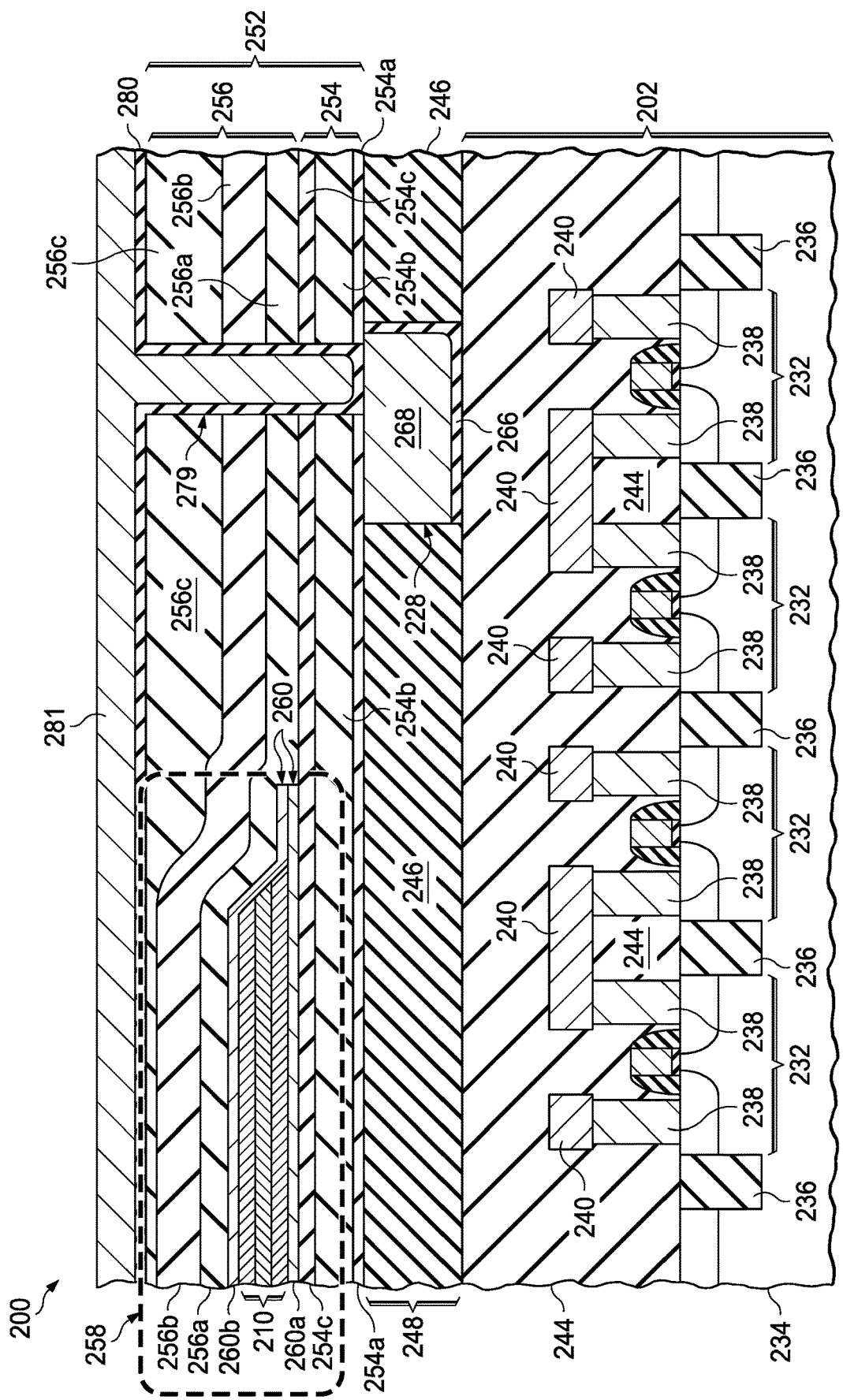
Figure 2L:
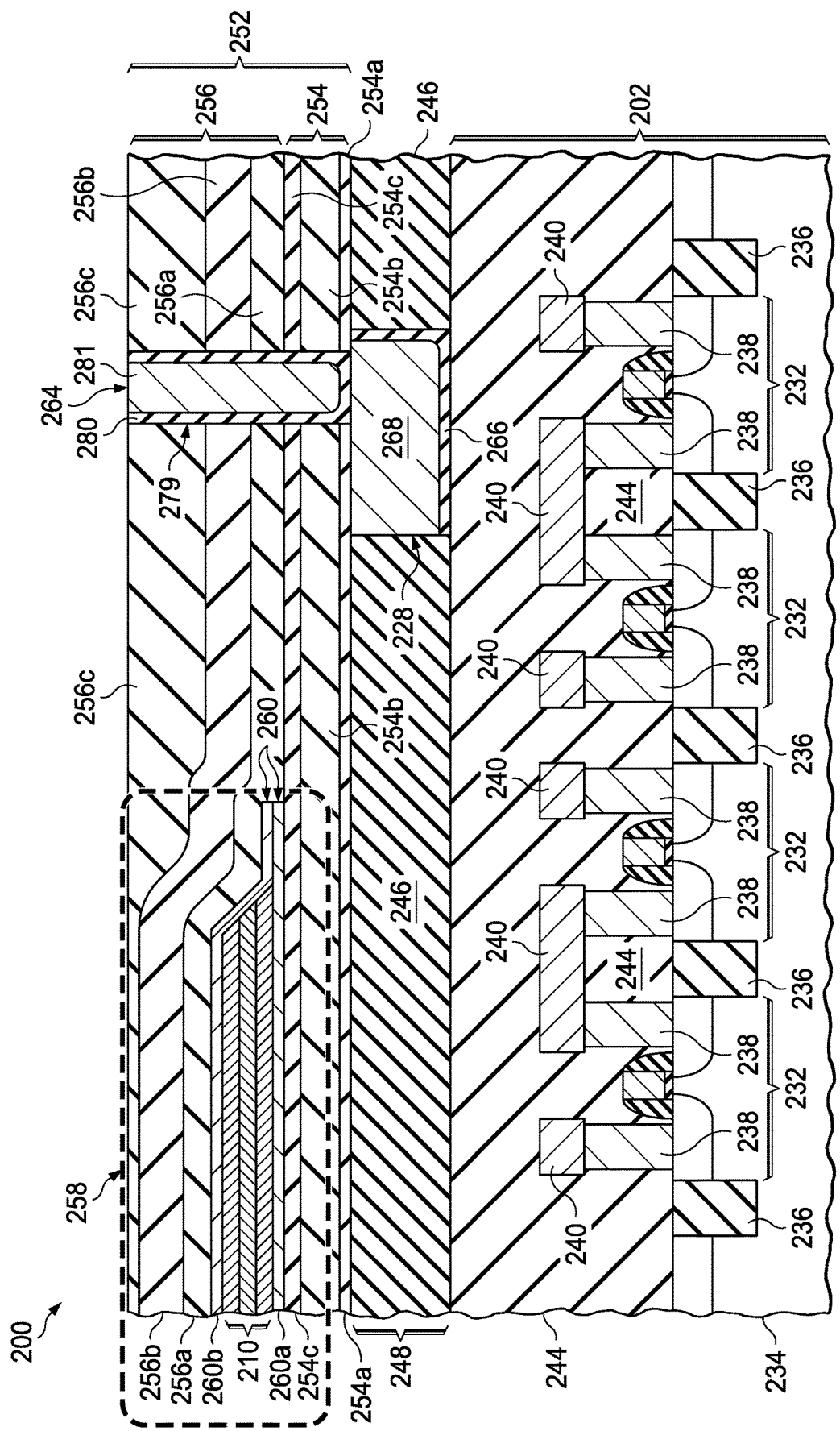
Figure 2M:
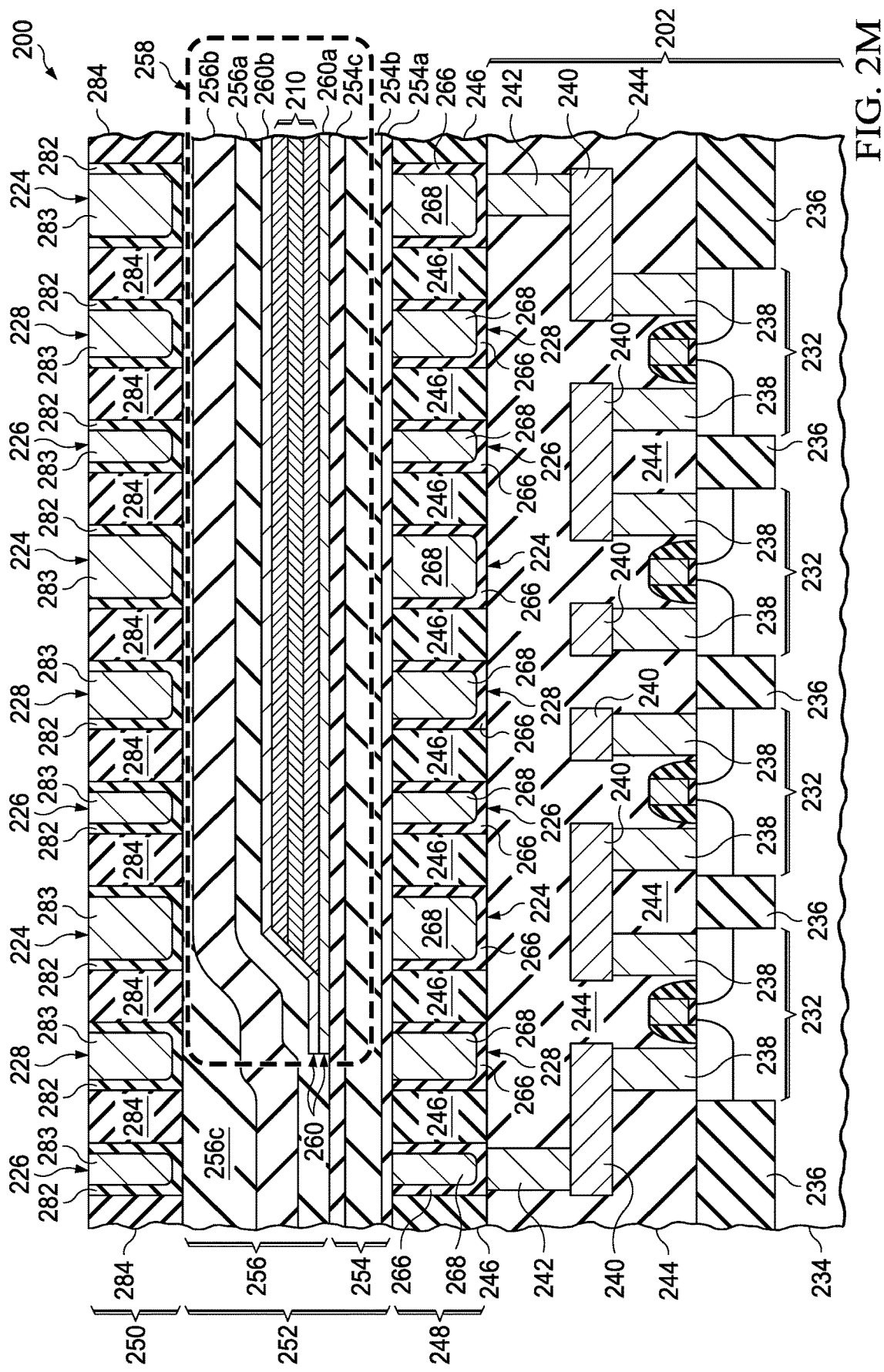
Figure 2N:
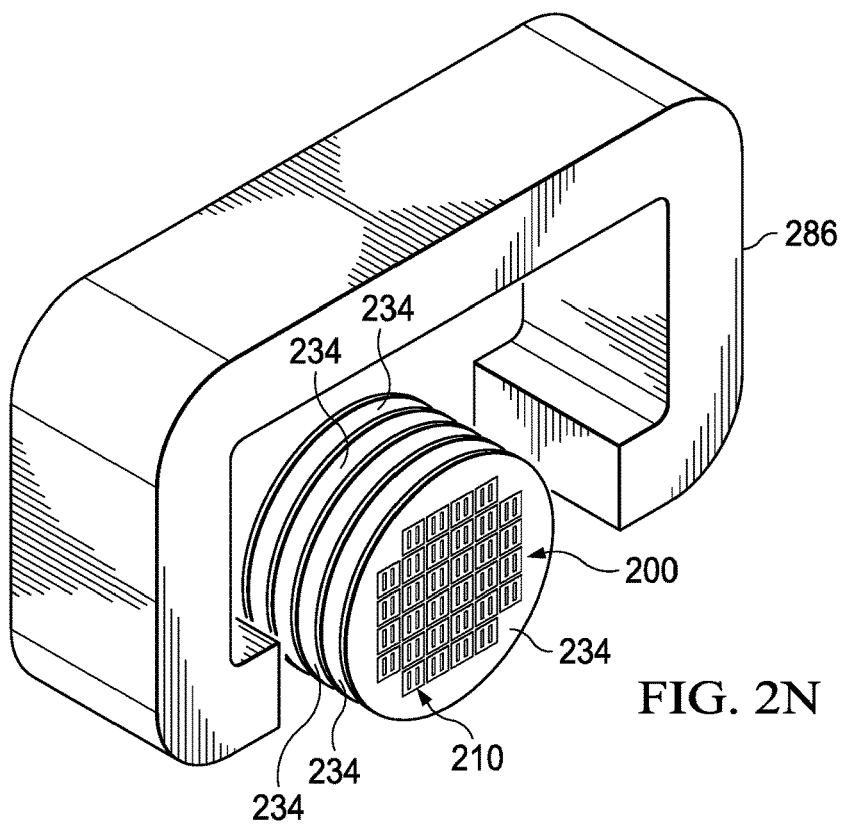

FIG. 2A through FIG. 2N are cross sections of an integrated fluxgate device, depicting an exemplary method of formation. Referring to FIG. 2A, which is a cross section along a length of a core segment of a magnetic core of the integrated fluxgate device, a substrate 234 comprising semiconductor material is provided for the integrated fluxgate device 200. The substrate 234 may be, for example, a silicon wafer, possibly with an epitaxial layer of silicon, or a silicon-on-insulator (SOI) wafer. The semiconductor material may include silicon, possibly doped with boron or phosphorus, or may include an alloy semiconductor material such as silicon with germanium or silicon with carbon. Other semiconductor materials are within the scope of the instant example.

Elements of field oxide 236 may be formed by a shallow trench isolation (STI) process or a local oxidation of silicon (LOCOS) process. Other structures may be used for laterally isolating the components in the substrate 234. Active components 232 are formed on the substrate 234. The active components 232 may be formed using planar processes for MOS transistors and/or bipolar transistors of analog or digital integrated circuits. A dielectric layer stack 244 is formed in stages over the active components 232 interspersed with forming contacts 238, metal lines 240 and vias 242. A PMD layer of the dielectric layer stack 244 may be formed first, and possibly planarized. The contacts 238 are formed through the PMD layer, for example by a tungsten damascene process using a titanium and/or titanium nitride liner. An IMD layer of the dielectric layer stack 244 may be formed next, followed by forming the metal lines 240 by a copper damascene process. Alternatively, the metal lines 240 may be formed by an aluminum masked-etch process, followed by forming the IMD layer between the metal lines 240. An ILD layer of the dielectric layer stack 244 may be formed next, followed by forming the vias 242 through the ILD layer. The vias 242 may be formed, for example, by a tungsten damascene process or by a copper damascene process. Additional levels of metallization comprising additional metal lines 240 and vias 242, with corresponding additional IMD layers and ILD layers, may be formed as part of the control circuit 202. A top surface of the dielectric layer stack 244 may be planarized, for example by an oxide chemical mechanical polish (CMP) process.

In the instant example, lower segments 248 of an excitation winding 224, a sense winding 226 and a compensation winding 228 are formed by a copper damascene process. A lower winding dielectric layer 246 is formed over the dielectric layer stack 244. Trenches are formed through the lower winding dielectric layer 246 for the lower segments 248 of the excitation winding 224, the sense winding 226, and the compensation winding 228. A metal liner 266 is formed in the trenches and over the lower winding dielectric layer 246. The metal liner 266 may comprise metals with barrier properties that reduce copper diffusion, such as tantalum, tantalum nitride, titanium and titanium nitride. A fill metal 268 comprising copper is formed on the metal liner 266, filling the trenches. The fill metal 268 may be formed by forming a seed layer comprising copper on the metal liner 266, for example by a sputter process, and by electroplating copper on the seed layer.

Referring to FIG. 2B, the fill metal 268 and the metal liner 266 are removed from over the lower winding dielectric layer 246, leaving the fill metal 268 and the metal liner 266 in the trenches to form the lower segments 248 of the excitation winding 224, the sense winding 226, and the compensation winding 228. The fill metal 268 and the metal liner 266 may be removed by a copper CMP process.

Referring to FIG. 2C, a lower isolation layer 254 of an isolation structure 252 is formed over the lower segments 248 of the excitation winding 224, the sense winding 226, and the compensation winding 228. In the instant example, the lower isolation layer 254 also provides part of a stress control structure 258 around a subsequently-formed magnetic core. In the instant example, the lower isolation layer 254 may include a cap layer 254a of silicon nitride or other dielectric material with barrier properties that reduce copper diffusion, formed directly over the lower segments 248 of the excitation winding 224, the sense winding 226, and the compensation winding 228. Stress in the cap layer 254a may be compressive with a magnitude of 50 megapascals (MPa) to 200 MPa.

In the instant example, the lower isolation layer 254 may include a lower-k layer 254b, denoted "lower-k" due to a lower dielectric constant than other layers in the lower isolation layer 254, of silicon dioxide-based dielectric material, formed over the cap layer 254a. The lower-k layer 254b may be 500 nanometers to 1000 nanometers thick and may be formed by a plasma enhanced chemical vapor deposition (PECVD) process using tetraethyl orthosilicate (TEOS). The lower-k layer 254b may have a dielectric constant of 3.0 to 3.9, which advantageously reduces capacitance between the subsequently-formed magnetic core and the lower segments 248 of the excitation winding 224, the sense winding 226, and the compensation winding 228. The lower isolation layer 254 may include a higher-stress layer 254c, denoted "higher-stress" due to a higher magnitude of compressive stress than the lower-k layer 254b, of silicon nitride-based dielectric material, formed above the lower-k layer 254b. The higher-stress layer 254c may be, for example, 50 nanometers to 200 nanometers thick, and may be formed by a PECVD process using a combination of silane and ammonia, or a PECVD process using bis(tertiary-butyl-amino) silane (BTBAS). Stress in the higher-stress layer 254c may be compressive with a magnitude of 50 MPa to 200 MPa.

Referring to FIG. 2D, a lower layer 260a of an adhesion/barrier structure 260 is formed over the lower isolation layer 254. The lower layer 260a of the adhesion/barrier structure 260 may include, for example, 10 nanometers to 50 nanometers of titanium or other refractory metal which has good adhesion to the lower isolation layer 254 and the subsequently-formed magnetic core, and barrier properties that reduce diffusion of transition metal from the magnetic core. The lower layer 260a of the adhesion/barrier structure 260 may be formed by a sputter process, for example, to promote adhesion to the lower isolation layer 254.

A magnetic core layer stack 270 is formed over the lower layer 260a of the adhesion/barrier structure 260. The magnetic core layer stack 270 may be formed by alternately sputtering layers of magnetic material and layers of electrically insulating material to provide a desired thickness of magnetic material for the magnetic core. The magnetic material may include the materials described in reference to the magnetic core 110 of FIG. 1A through FIG. 1C. The electrically insulating material may be selected to have good adhesion to the magnetic material and an etch rate comparable to the magnetic material to facilitate a subsequent core etch process. In a version of the instant example using an alloy of iron and nickel for the magnetic material, aluminum nitride may be advantageously used for the electrically insulating material. The layers of magnetic material may be sufficiently thin so as to suppress eddy currents during operation of the integrated fluxgate device 200. For example, in the version of the instant example using an alloy of iron and nickel for the magnetic material, each layer of magnetic material may have a thickness of 200 nanometers to 500 nanometers. The layers of electrically insulating material are sufficiently thick so as to prevent current flow between the layers of magnetic material induced by time-varying magnetic fields during operation of the integrated fluxgate device 200. For example, each layer of electrically insulating material may have a thickness of 5 nanometers to 20 nanometers. A total thickness of the magnetic core layer stack 270 is selected to provide a desired resolution of the integrated fluxgate device 200, while maintaining a manageable level of stress compatible with the stress control structure 258. For example, in the version of the instant example using an alloy of iron and nickel for the magnetic material, a total thickness of the magnetic core layer stack 270 may be 1 micron to 2 microns. The magnetic material in the magnetic core layer stack 270 may be magnetized in a preferred direction, for example parallel to widths of subsequently-formed core segments and perpendicular to lengths of the core segments, during formation of the layers of the magnetic material. For example, a permanent magnet or an electromagnet may provide a magnetic field with a desired orientation during formation of the layers of magnetic material. A core mask 272 is formed over the magnetic core layer stack 270 which covers an area for the subsequently-formed magnetic core. The core mask 272 may include photoresist formed by a photolithographic process, and may also include an anti-reflection layer. Alternatively, the core mask 272 may include hard mask materials such as silicon dioxide and/or silicon nitride, patterned using a photoresist mask. The area covered by the core mask 272 includes areas for a first core segment and a second core segment of the magnetic core.

Referring to FIG. 2E, the magnetic material and electrically insulating material are removed from the magnetic core layer stack 270 of FIG. 2D by a core etch process 274, where exposed by the core mask 272, to form a magnetic core 210. The core etch process 274 may be a wet etch, as indicated in FIG. 2E, comprising an aqueous solution of nitric acid, acetic acid and phosphoric acid. Concentrations of the acids may be adjusted to provide a comparable etch rate of the magnetic material and electrically insulating material, and to provide etch rate selectivity to the lower layer 260a of the adhesion/barrier structure 260. A wet etch may provide a sloped edge on the magnetic core 210, which may advantageously reduce stress in the isolation structure 252 around a lateral boundary of the magnetic core 210. Other etch process for the core etch process 274 are within the scope of the instant example. The core mask 272 is subsequently removed, for example by an ash process.

Referring to FIG. 2F, an upper layer 260b of the adhesion/barrier structure 260 is formed over the magnetic core 210. The upper layer 260b may include, for example, 100 nanometers to 200 nanometers of titanium or other refractory metal which has good adhesion to the magnetic core 210, and barrier properties that reduce diffusion of transition metal from the magnetic core. The upper layer 260b may have a similar composition to the lower layer 260a of the adhesion/barrier structure 260. The upper layer 260b of the adhesion/barrier structure 260 may be formed by a sputter process, for example, to promote adhesion to the magnetic core 210.

An adhesion/barrier mask 276 is formed over the upper layer 260b of the adhesion/barrier structure 260 to cover the magnetic core 210. The adhesion/barrier mask 276 may include photoresist formed by a photolithographic process, and may optionally include anti-reflection material. Alternatively, the adhesion/barrier mask 276 may include hard mask material such as silicon dioxide and/or silicon nitride, patterned using a photoresist mask.

Referring to FIG. 2G, the upper layer 260b and the lower layer 260a of the adhesion/barrier structure 260 are removed where exposed by the adhesion/barrier mask 276, to form the adhesion/barrier structure 260. The upper layer 260b and the lower layer 260a may be removed, for example, by a reactive ion etch (ME) process using fluorine radicals. The adhesion/barrier mask 276 is subsequently removed, for example by an ash process.

Referring to FIG. 2H, an upper isolation layer 256 of the isolation structure 252 is formed over the magnetic core 210 and the upper layer 260b of the adhesion/barrier structure 260. In the instant example, the upper isolation layer 256 may include a conformal higher-stress layer 256a of silicon nitride-based dielectric material, formed above the upper layer 260b of the adhesion/barrier structure 260. The higher-stress layer 256a may be, for example, 200 nanometers to 600 nanometers thick, and may be formed by a process similar to the process used to form the higher stress layer 254c of the lower isolation layer 254, described in reference to FIG. 2C. Stress in the higher-stress layer 256a may be compressive with a magnitude of 50 MPa to 200 MPa.

The upper isolation layer 256 may include a conformal first lower-k layer 256b formed over the higher stress layer 254c. The first lower-k layer 256b may be, for example, 300 nanometers to 700 nanometers of silicon dioxide-based dielectric material with a compressive stress of 100 MPa to 150 MPa. The first lower-k layer 256b may be formed by a chemical vapor deposition reaction using silane and nitrous oxide at 350° C. to 400° C.

The upper isolation layer 256 may further include a second lower-k layer 256c formed over the first lower-k layer 256b. The second lower-k layer 256c may be, for example, 400 nanometers to 800 nanometers of silicon dioxide-based dielectric material. The second lower-k layer 256c may be formed by a PECVD process using TEOS. The thicknesses and stress levels of the layers in the upper isolation layer 256 are selected to provide a desired compressive stress, after a subsequent planarization of the upper isolation layer 256, which reduces structural defects in the magnetic core 210.

Referring to FIG. 2I, the upper isolation layer 256 may be optionally planarized over the magnetic core 210. The upper isolation layer 256 may be planarized by an oxide CMP process, or by an etchback process in which a polymer is spin coated over the upper isolation layer 256 to provide a planar top surface, followed by a plasma etch process which removes the polymer material and material from the upper isolation layer 256 at comparable rates, substantially planarizing the upper isolation layer 256. In one version of the instant example, silicon dioxide-based dielectric material from the second lower-k layer 256c may be left over the magnetic core 210, as depicted in FIG. 2I. In another version, all the dielectric material from the second lower-k layer 256c may be removed over the magnetic core 210. The stress control structure 258 comprises the lower isolation layer 254, the adhesion/barrier structure 260 and the upper isolation layer 256 above and below the magnetic core 210.

Referring to FIG. 2J, which is a cross section across the magnetic core 210, a winding via mask 278 is formed over the isolation structure 252 which exposes an area for a subsequently-formed winding via over the lower segment 248 of the compensation winding 228, and covers the magnetic core 210. The winding via mask 278 also exposes areas for a plurality of subsequently-formed winding vias over the lower segments 248 of the excitation winding 224, the sense winding 226, and the compensation winding 228, out of the plane of FIG. 2J. The winding via mask 278 may include hard mask material such as silicon carbide or amorphous carbon. The winding via mask 278 may be formed by forming one or more layers of the hard mask material over the isolation structure 252, and forming a photoresist mask over the layers of the hard mask material. The layers of hard mask material are subsequently etched to expose the isolation structure 252, forming the winding via mask 278. The photoresist mask may be left in place or may be removed at this point.

A winding via hole 279 is formed through the isolation structure 252 in the area exposed by the winding via mask 278. The winding via hole 279 may be formed by an RIE process, using a combination of fluorine-containing reagent gas, hydrocarbon reagent gas, and carrier gas. The ME process may include a plurality of steps in which reactant gas flows, pressure, and/or power may be varied depending on compositions of the layers comprising the isolation structure 252. Each step of the RIE process removes material from a bottom of the partially etched winding via hole 279 while passivating sidewalls of the partially etched winding via hole 279 to reduce lateral etching, and thus to form the winding via hole 279 with substantially smooth sidewalls and minimal undercut regions. In particular, etching through silicon dioxide-based materials requires different reactant gas flows, pressure, and/or power than etching through silicon nitride-based materials. Forming the winding via hole 279 with straight, smooth sidewalls may advantageously improve reliability of the subsequently-formed winding via.

Subsequently, the winding via mask 278 is removed. Amorphous carbon and organic material in the winding via mask 278 may be removed by an ash process. Silicon carbide in the winding via mask 278 may be removed by a plasma etch process.

Referring to FIG. 2K, a metal liner 280 is formed over the isolation structure 252, extending into the winding via hole 279 and contacting the lower segment 248 of the compensation winding 228. Forming the winding via hole 279 with straight, smooth sidewalls as described in reference to FIG. 2J may provide the metal liner 280 with continuous coverage and substantially uniform thickness over boundaries between the layers of the isolation structure 252, which may advantageously improve reliability of the subsequently-formed winding via. The metal liner 280 may have a similar composition to, and may be formed by a similar process as, the metal liner 266 in the lower segment 248 of the compensation winding 228.

A fill metal 281 comprising copper is formed on the metal liner 280, filling the winding via hole 279. The fill metal 281 may be formed similarly to the fill metal 268 in the lower segment 248 of the compensation winding 228.

Referring to FIG. 2L, the fill metal 281 and metal liner 280 are removed from over the isolation structure 252, leaving the fill metal 281 and the metal liner 280 in the winding via hole 279 to form the winding via 264 on the compensation winding 228. The fill metal 281 and the metal liner 280 may be removed by a copper CMP process. A plurality of winding vias are formed concurrently, contacting the lower segments 248 of the excitation winding 224, the sense winding 226, and the compensation winding 228, out of the plane of FIG. 2L.

Referring to FIG. 2M, which is a cross section along the length of the core segment as shown in FIG. 2A through FIG. 2I, upper segments 250 of the excitation winding 224, the sense winding 226, and the compensation winding 228 are formed over the isolation structure 252. The upper segments 250 are coupled through the winding vias, represented by the winding via 264 of FIG. 2L, to the lower segments 248 of the excitation winding 224, the sense winding 226, and the compensation winding 228. The upper segments 250 may be formed by a copper damascene process, similar to the lower segments 248, as described in reference to FIG. 2A and FIG. 2B, including a metal liner 282 and a fill metal 283 comprising copper. The upper segments 250 of the excitation winding 224, the sense winding 226, and the compensation winding 228 may be formed in trenches through a layer of dielectric material 284. Additional layers of dielectric material and bond pads are subsequently formed over the upper segments 250. In another version of the instant example, the winding vias, including the winding via 264 of FIG. 2L, may be formed concurrently with the upper segments 250 of the excitation winding 224, the sense winding 226, and the compensation winding 228 by a copper dual damascene process.

Referring to FIG. 2N, the integrated fluxgate device 200 is exposed to a magnetic field so as to align magnetic moments in the magnetic core 210 in a preferred orientation. The integrated fluxgate device 200 may be disposed on a substrate wafer 234 with a plurality of similar integrated fluxgate devices 200. The magnetic field may be provided by a permanent magnet 286, as depicted in FIG. 2N, or by an electric current in an electromagnet. A plurality of the substrate wafers 234 containing instances of the integrated fluxgate devices 200 may be exposed concurrently to the magnetic field. The substrate wafer 234 may be heated while being exposed to the magnetic field, for example at a temperature of 300° C. to 400° C., which may advantageously reduce a time needed to attain a desired alignment of the magnetic moments in the magnetic core 210. The integrated fluxgate device 200 may be exposed to the magnetic field during fabrication of the integrated fluxgate device 200 or after fabrication is completed.

Figure 3:
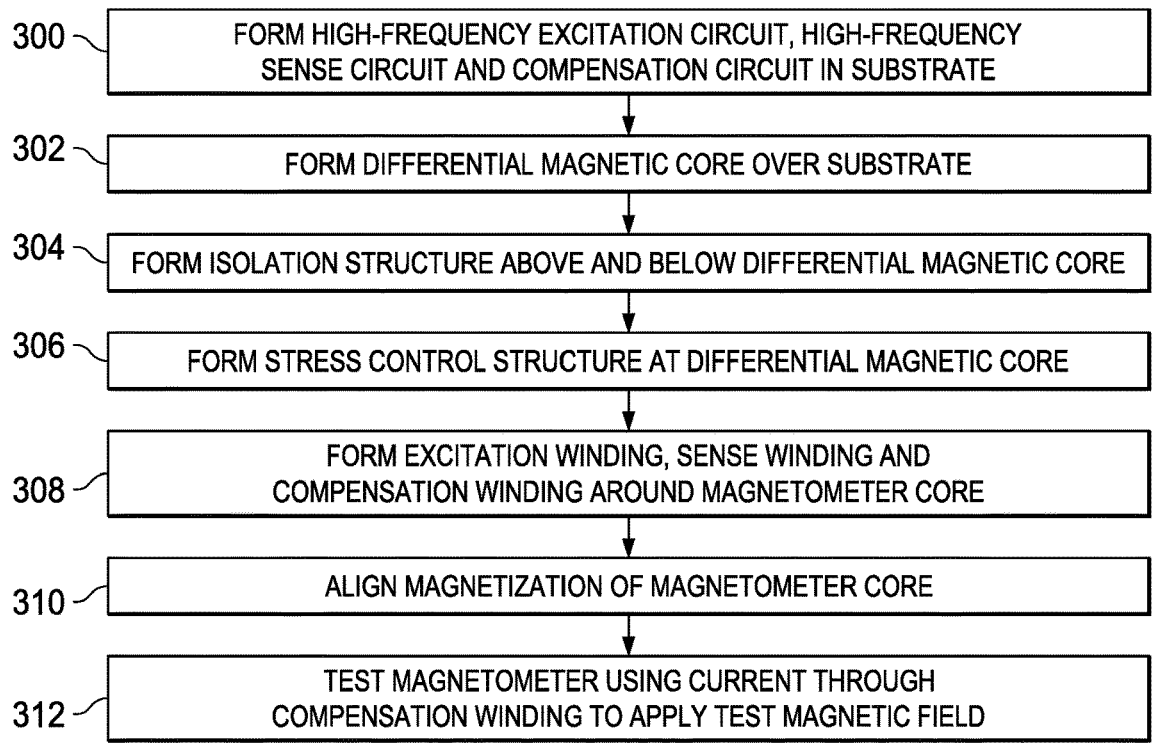
FIG. 3 is a flowchart of an example method of forming an integrated fluxgate device.

FIG. 3 is a flowchart of an example method of forming an integrated fluxgate device. The method begins with operation 300, which is to form an excitation circuit, a sense circuit and a compensation circuit in a semiconductor substrate of a control circuit of the integrated fluxgate device. The excitation circuit is formed to be configured to provide current at the high frequency to an excitation winding sufficient to generate a saturating magnetic field in a magnetic core during each cycle at the high frequency. The sense circuit is configured to provide an output signal which is a function of a combined voltage difference provided by a sense winding coupled to the sense circuit. The compensation circuit is configured to provide current to a compensation winding sufficient to generate a compensation magnetic field in the magnetic core.

Operation 302 of the method is to form the magnetic core over the semiconductor substrate. The magnetic core includes two parallel core segments of magnetic material. Each core segment has a volume and internal structure sufficient to provide a desired resolution and linearity of the integrated fluxgate device. The magnetic core may be formed as described in reference to FIG. 2D and FIG. 2E.

Operation 304 is to form an isolation structure above and below the magnetic core, configured to enable operation of the integrated fluxgate device at the high frequency. A lower portion of the isolation structure may be formed prior to forming the magnetic core, so that the lower portion is disposed below the magnetic core. An upper portion of the isolation structure may be formed after forming the magnetic core, so that the upper portion is disposed over the magnetic core.

Operation 306 is to form a stress control structure at the magnetic core. The stress control structure may be disposed above and/or below, as well as laterally around, the magnetic core. A first portion of the stress control structure may be formed prior to forming the magnetic core, so that the first portion is disposed below the magnetic core. The first portion of the stress control structure may be part of the lower portion of the isolation structure. A second portion of the stress control structure may be formed after forming the magnetic core, so that the second portion is disposed over the magnetic core. The second portion of the stress control structure may be part of the upper portion of the isolation structure.

Operation 308 is to form an excitation winding, a sense winding, and a compensation winding around the magnetic core, isolated from the magnetic core by the isolation structure. The excitation winding is coupled to the excitation circuit. The sense winding is configured to the sense circuit. The compensation winding is configured to the compensation circuit. Lower segments of the excitation winding, the sense winding, and the compensation winding may be formed prior to forming the lower portion of the isolation structure. Upper segments of the excitation winding, the sense winding, and the compensation winding may be formed after forming the upper portion of the isolation structure. The upper segments are coupled to the corresponding lower segments through winding vias formed after the lower segments and prior to the upper segments.

Operation 310 is to align magnetic moments in the magnetic core in a preferred orientation.

Operation 312 is to test the integrated fluxgate device using current through the compensation winding to apply a test magnetic field. Using the compensation winding to apply the test magnetic field enables testing the integrated fluxgate device using conventional test equipment for integrated circuits, without requiring a separate magnetic field generating apparatus to generate the test magnetic field, advantageously reducing test cost of the integrated fluxgate device.

Figure 4A:
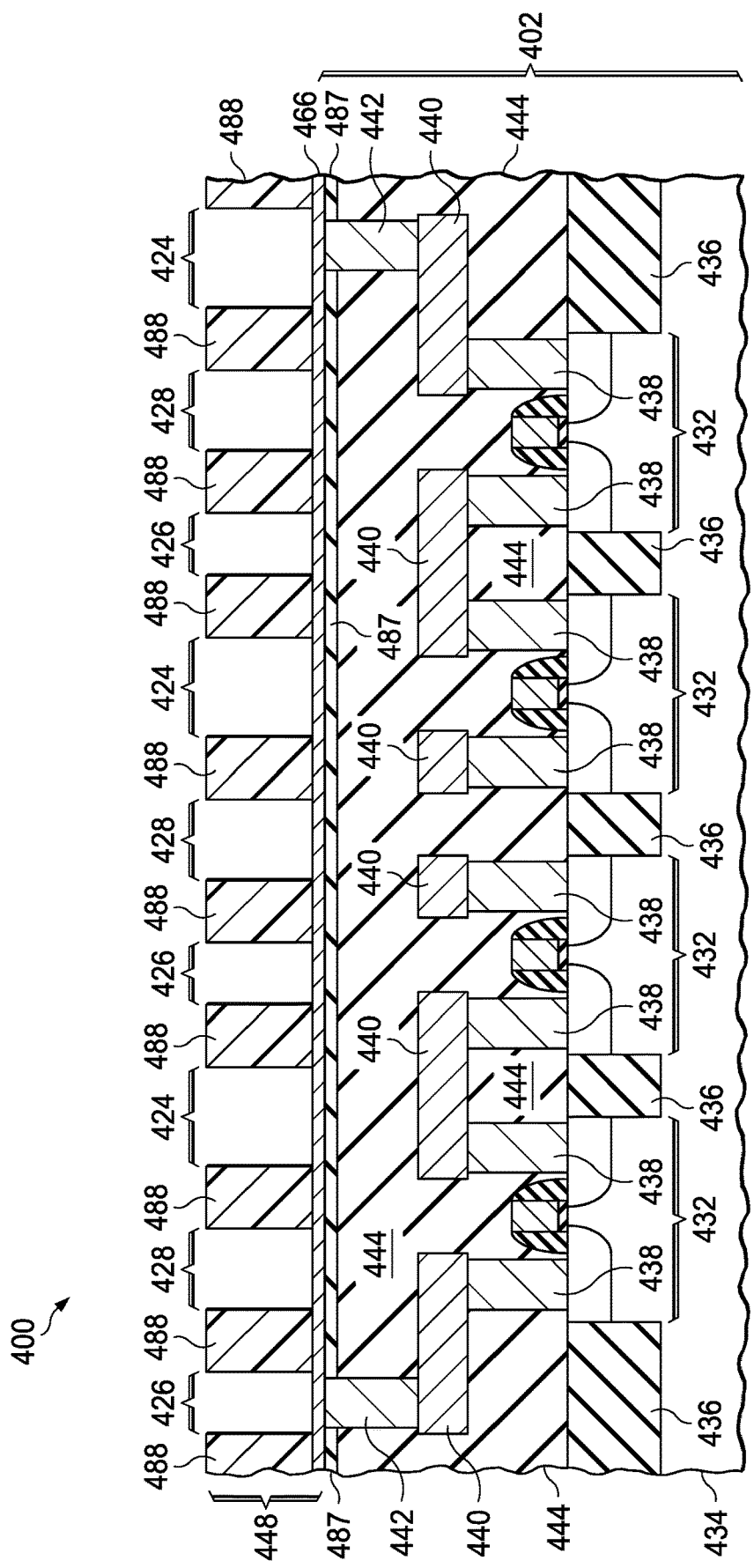
FIG. 4A through FIG. 4L are cross sections of an integrated fluxgate device, depicting another exemplary method of formation.

FIG. 4A through FIG. 4L are cross sections of an integrated fluxgate device, depicting another exemplary method of formation. Referring to FIG. 4A, which is a cross section along a length of a core segment of a magnetic core, the integrated fluxgate device 400 has a control circuit 402 with a substrate 434 comprising semiconductor material, and with elements of field oxide 436 laterally isolating active components 432. A dielectric layer stack 444 of the control circuit 402 with contacts 438, metal lines 440 and vias 442 is formed over the active components 432. A cap layer 487 comprising silicon nitride or other dielectric material with an etch rate lower than silicon dioxide may be included at a top surface of the dielectric layer stack 444.

In the instant example, lower segments 448 of an excitation winding 424, a sense winding 426 and a compensation winding 428 are formed by a copper masked plating process. A plating seed layer 466 is formed over the dielectric layer stack 444, on the cap layer 487, and contacting the vias 442 extending through the cap layer 487. The plating seed layer 466 may include an adhesion layer comprising titanium on the cap layer 487 and a copper layer at a top surface of the plating seed layer 466. The adhesion layer and the copper layer may be formed by sequential sputter processes. A plating mask 488 is formed over the plating seed layer 466, exposing areas for the lower segments 448 of the excitation winding 424, the sense winding 426, and the compensation winding 428. The plating mask 488 may include a photosensitive organic polymer such as photoresist, formed by a photolithographic process. A thickness of the plating mask 488 may be at least as thick as desired thicknesses of the lower segments 448.

Figure 4B:
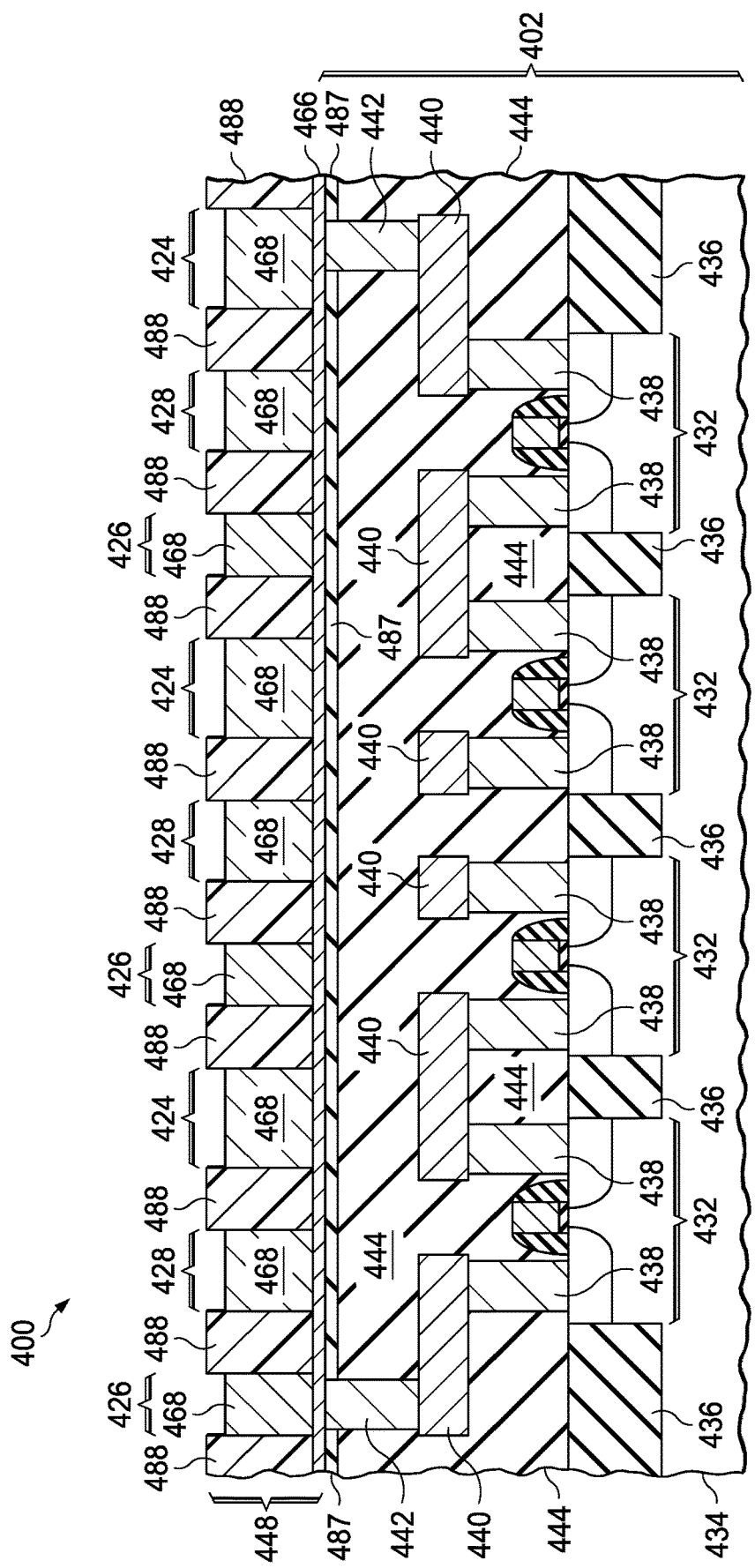

Referring to FIG. 4B, fill metal 468 of copper is formed in the lower segments 448 of the excitation winding 424, the sense winding 426, and the compensation winding 428 by electroplating copper on the plating seed layer 466 in the areas exposed by the plating mask 488. The plating seed layer 466 provides a common electrical electrode for plating the fill metal 468 in each of the lower segments 448. The fill metal 468 may extend proximate to a top surface of the plating mask 488, which may advantageously define lateral boundaries of the lower segments 448.

Figure 4C:
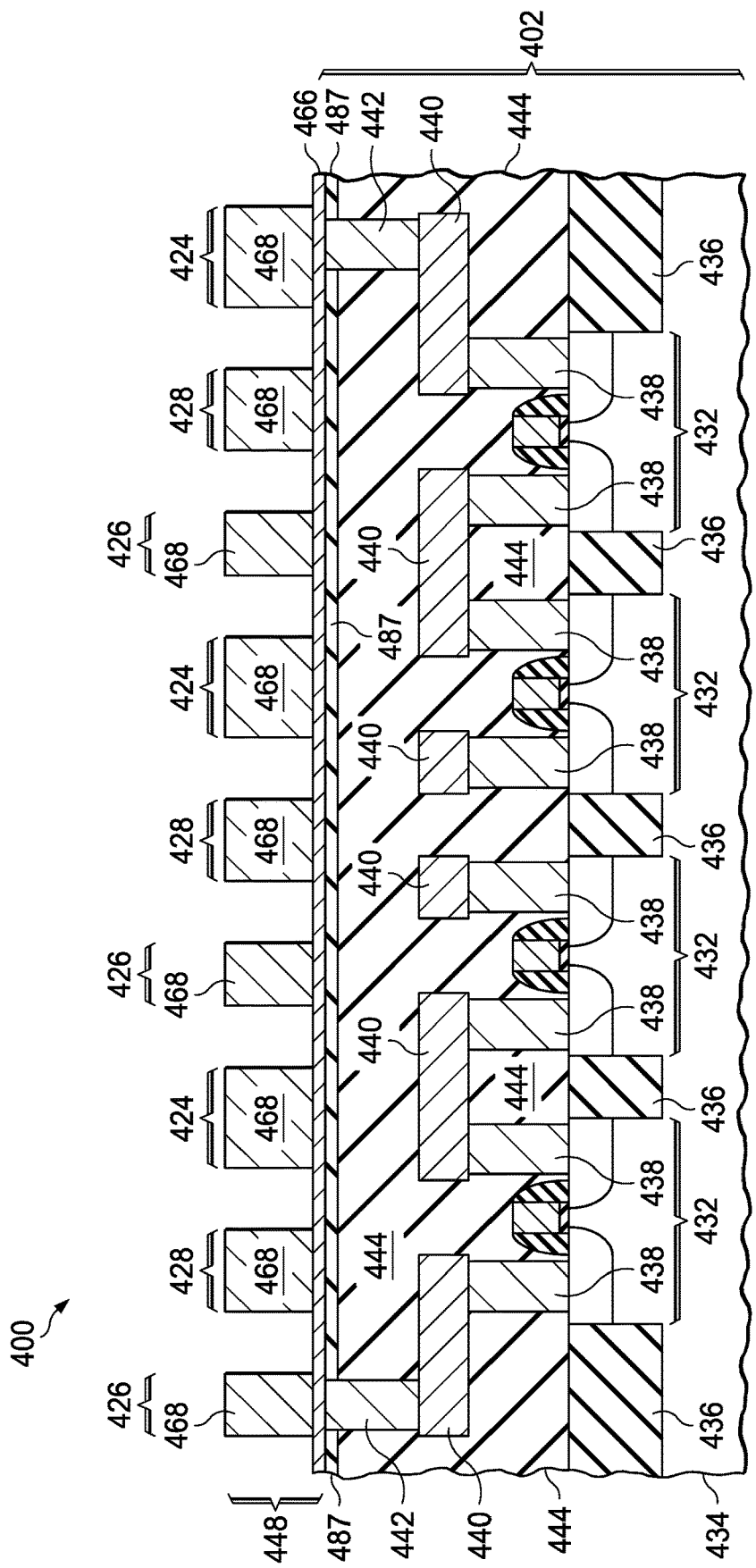

Referring to FIG. 4C, the plating mask 488 of FIG. 4B is removed, leaving the lower segments 448 of the excitation winding 424, the sense winding 426, and the compensation winding 428 on the plating seed layer 466. The plating mask 488 may be removed, for example, by a wet process using a mixture of a solvent and an organic acid. Alternatively, the plating mask 488 may be removed by a dry process using oxygen radicals, such as an ozone etch process or a downstream ash process. A combination of a wet etch and a dry etch may be used to remove the plating mask 488.

Figure 4D:
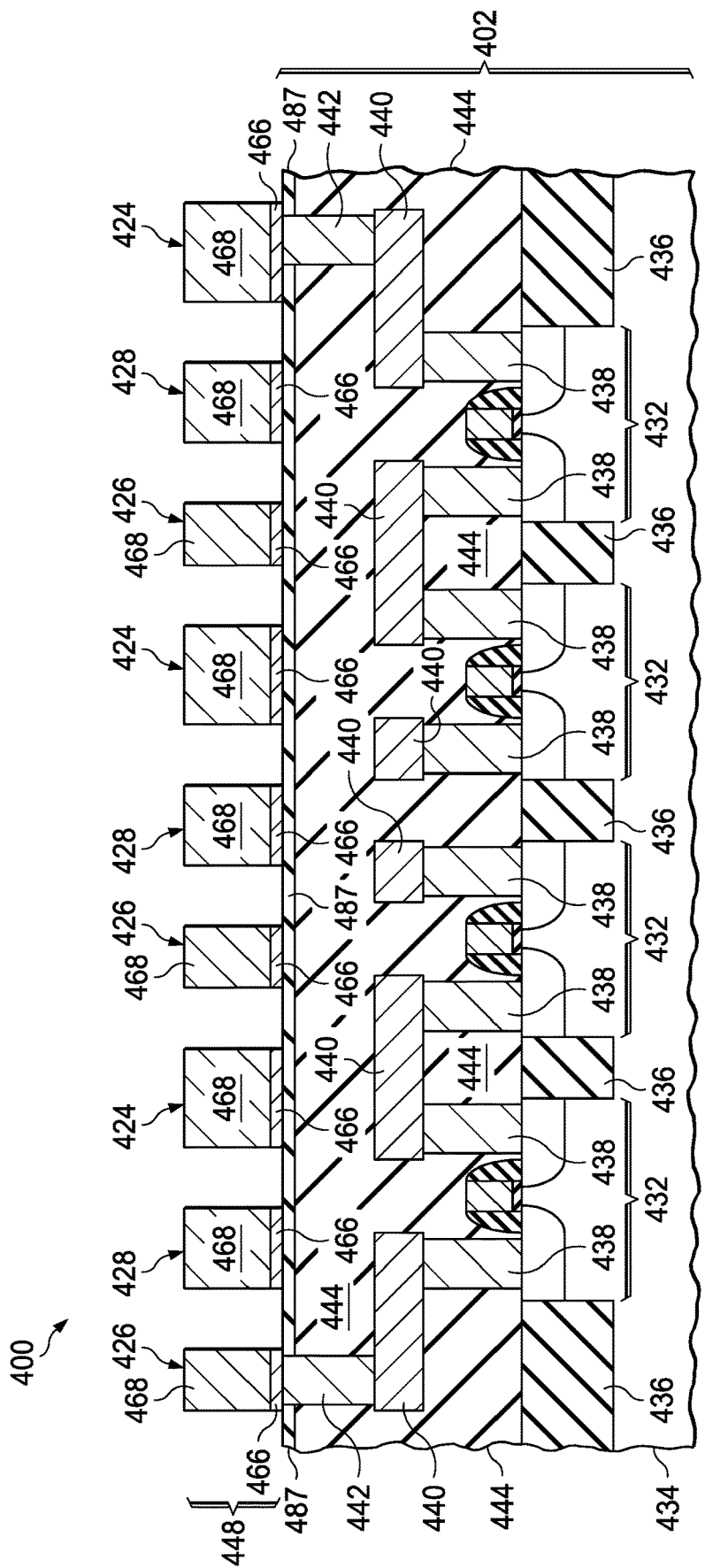

Referring to FIG. 4D, the plating seed layer 466 is removed from areas outside of the electroplated copper portions of the lower segments 448 of the excitation winding 424, the sense winding 426, and the compensation winding 428, leaving the plating seed layer 466 directly under the fill metal 468 in each of the lower segments 448. The plating seed layer 466 may be removed, for example, by a timed wet etch process. The lower segments 448 of the excitation winding 424, the sense winding 426, and the compensation winding 428 include the electroplated copper fill metal 468 and the plating seed layer 466.

Figure 4E:
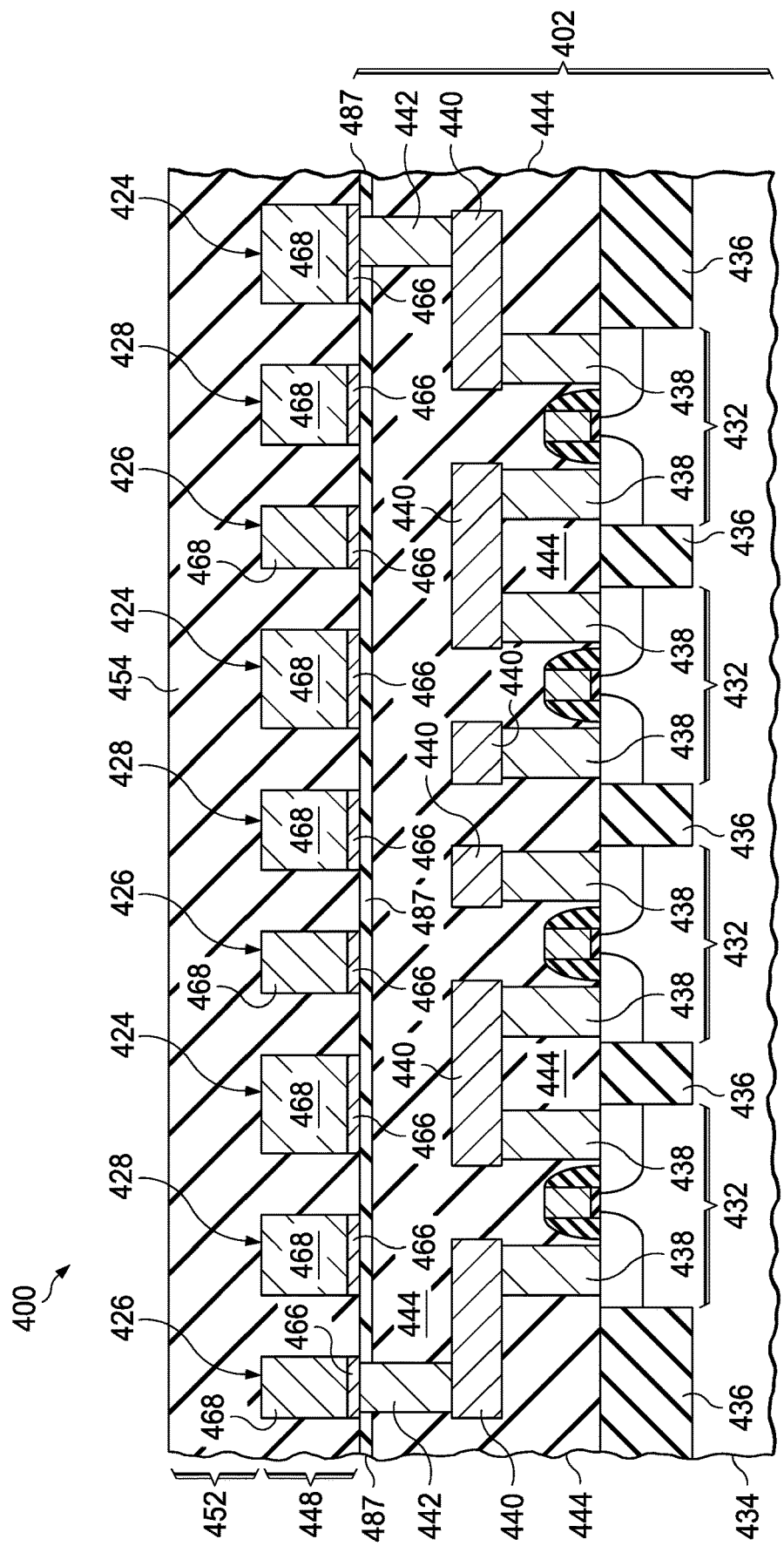
Figure 4F:
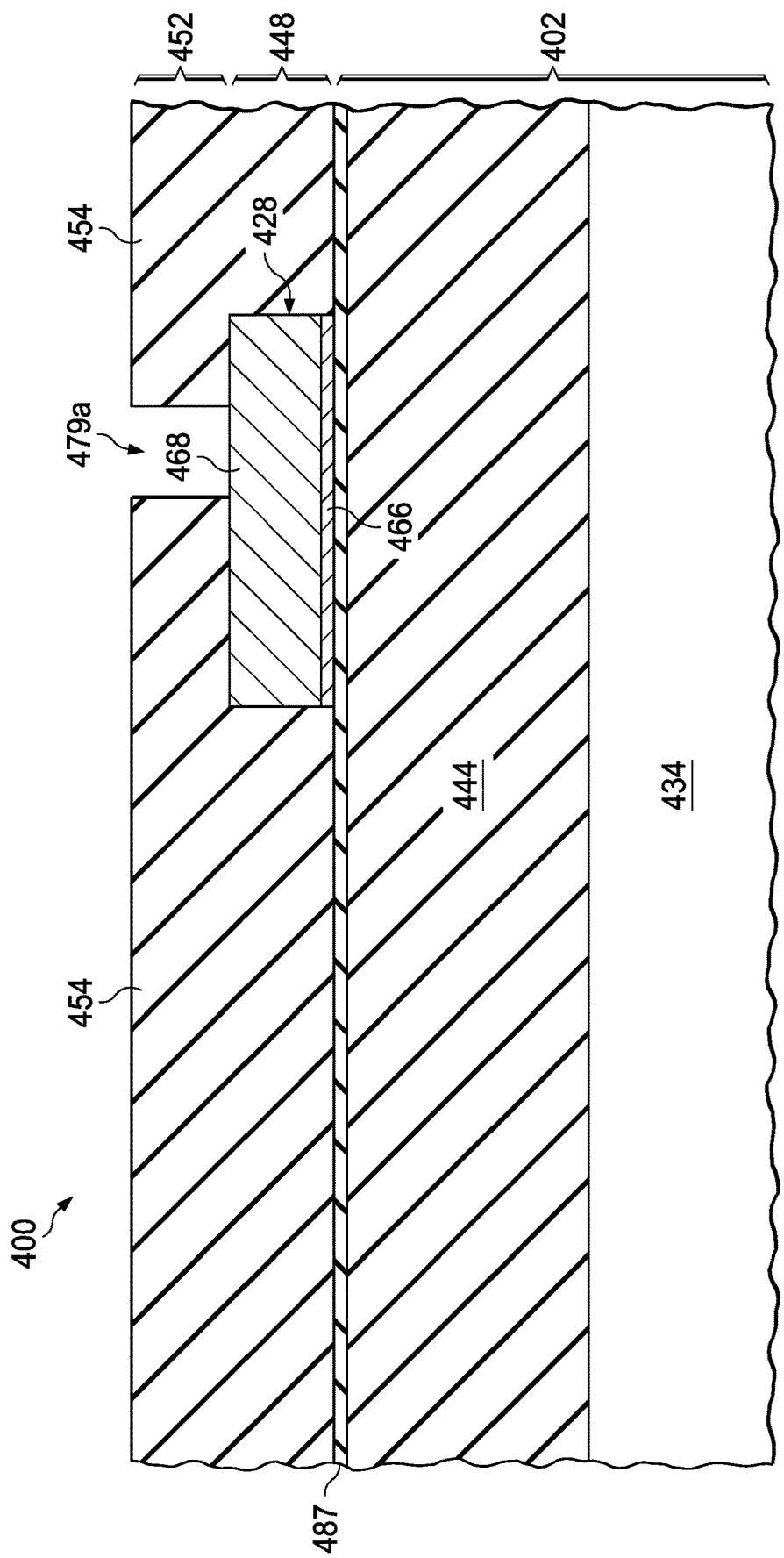

FIG. 4E and FIG. 4F depict the integrated fluxgate device 400 at the same operation, along two different cross section planes. Referring to FIG. 4E, which is a cross section along the length of the magnetic core, a lower isolation layer 454 of an isolation structure 452 is formed over the lower segments 448 of the excitation winding 424, the sense winding 426, and the compensation winding 428, extending into spaces between the lower segments 448. In the instant example, the lower isolation layer 454 may comprise an organic polymer, such as a photosensitive polyimide, a photo sensitive epoxy, or a photosensitive silicone. The lower isolation layer 454 may be formed by spin coating a solution of the photoimageable organic polymer dissolved in a solvent, followed by baking to remove at least a portion of the solvent. The lower isolation layer 454 is subsequently exposed to appropriate ultraviolet light from a photolithographic printer, and developed, to form lower portions of winding vias, one of which is shown in FIG. 4F below. The lower isolation layer 454 is then baked to provide desired chemical stability and mechanical properties for the lower isolation layer 454. The spin coating process advantageously provides a substantially planar top surface of the lower isolation layer 454 over the lower segments 448, while providing good fill characteristics of the spaces between the lower segments 448. The lower isolation layer 454 may be, for example, 500 nanometers to 3 microns thick over the lower segments 448. 500 nanometers of the organic polymer is sufficient to provide isolation and stress control for a subsequently-formed magnetic core.

Referring to FIG. 4F, which is a cross section across the magnetic core and through a winding via, when the lower isolation layer 454 is exposed to the ultraviolet light from the photolithographic printer as described in reference to FIG. 4E, a lower via hole 479a is patterned in the photoimageable organic polymer of the lower isolation layer 454. When the lower isolation layer 454 is developed as described in reference to FIG. 4E, the lower via hole 479a is formed, exposing a lower segment 448 of the compensation winding 428.

Alternatively, the organic polymer used for the lower isolation layer 454 may be photo-insensitive, and the lower via hole 479a may be formed by a masked etch process such as an RIE process using oxygen radicals. A photo-insensitive organic polymer may provide more desirable material properties for isolation and stress control for the subsequently-formed magnetic core.

A plurality of lower winding via holes are formed concurrently with the lower via hole 479a, each of which exposes a corresponding lower segment 448 of the excitation winding 424, the sense winding 426, and the compensation winding 428. The lower segments 448 of the excitation winding 424 and the sense winding 426 are out of the plane of FIG. 4F.

Figure 4G:
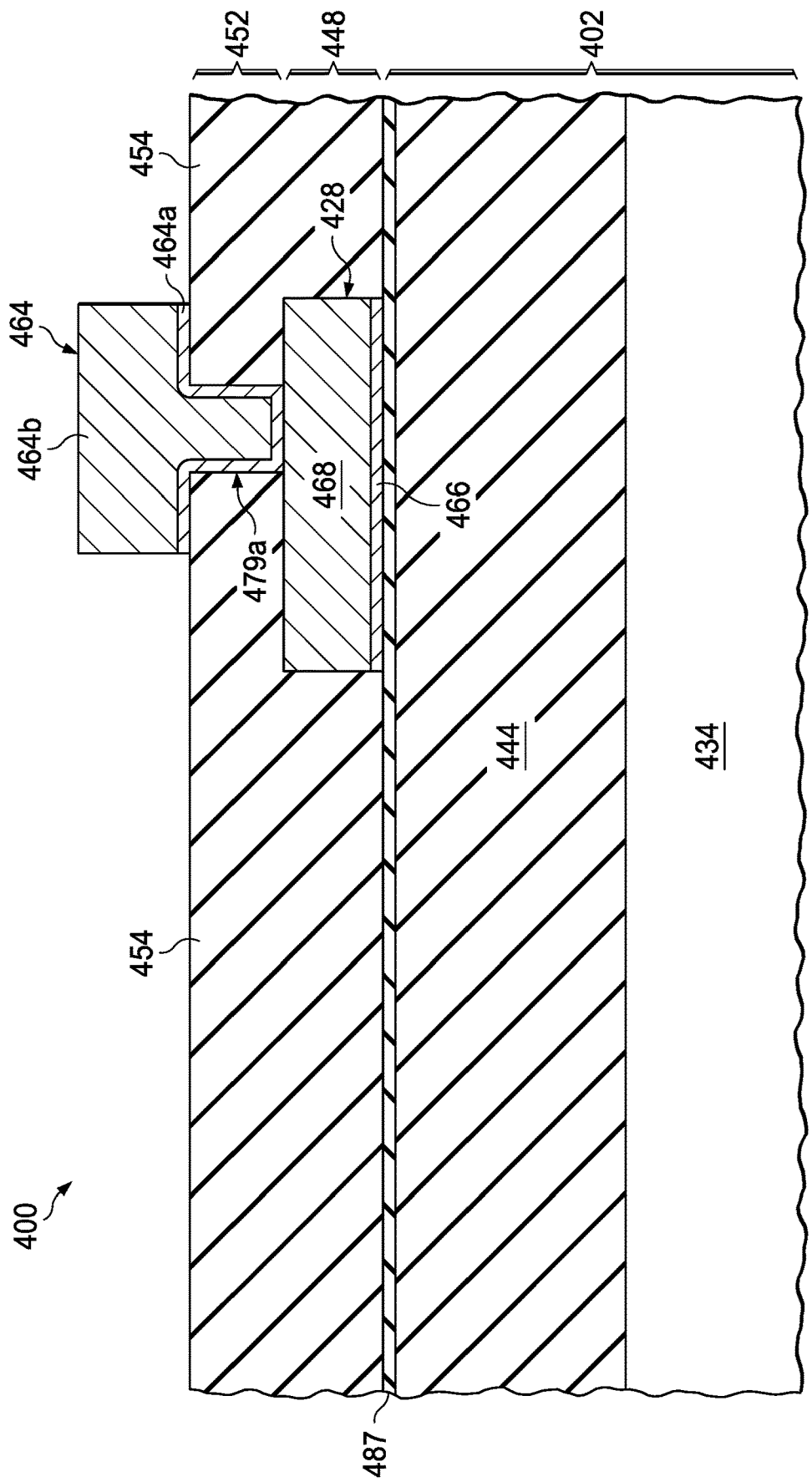

Referring to FIG. 4G, a lower winding via 464 is formed in the lower via hole 479a, contacting the lower segment 448 of the compensation winding 428. In the instant example, the lower winding via 464 is formed by a copper masked plating process, with a plating seed layer 464a on sidewalls and a bottom of the lower via hole 479a, and a copper fill metal 464b formed on the plating seed layer 464a by an electroplating process, similar to the process to form the lower segments 448 described in reference to FIG. 4A through FIG. 4D.

Figure 4H:
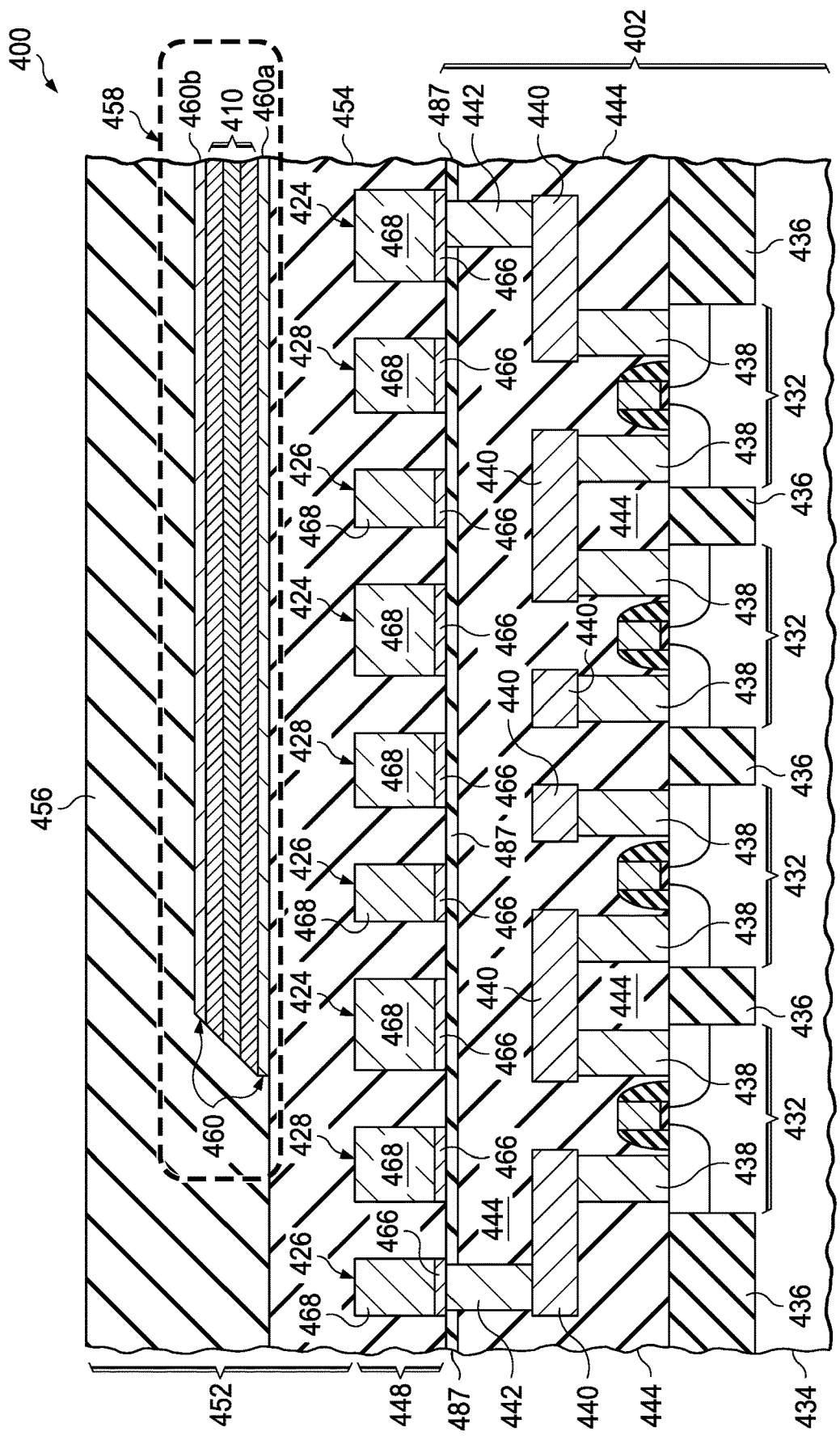

Referring to FIG. 4H, which is a cross section along the length of the core segment as shown in FIG. 4A through FIG. 4E, the magnetic core 410 is formed over the lower isolation layer 454. The magnetic core 410 may be formed by sputtering alternating layers of magnetic material and layers of electrically insulating material, as described in reference to FIG. 2D, followed by masking and etching as described in reference to FIG. 2E. An adhesion/barrier structure 460 comprising a lower layer 460a and/or an upper layer 460b may be formed above and/or below the magnetic core 410, respectively. The lower layer 460a and the upper layer 460b may include titanium, which promote adhesion and provides an effective barrier to metal diffusion from the layers of magnetic material. In the instant example, the lower layer 460a may be formed prior to forming the alternating layers of magnetic material and layers of electrically insulating material, and the upper layer 460b may be formed on the alternating layers of magnetic material and layers of electrically insulating material, prior to the masking and etching processes, so that the lower layer 460a and the upper layer 460b are patterned together with the magnetic core 410.

Figure 4I:
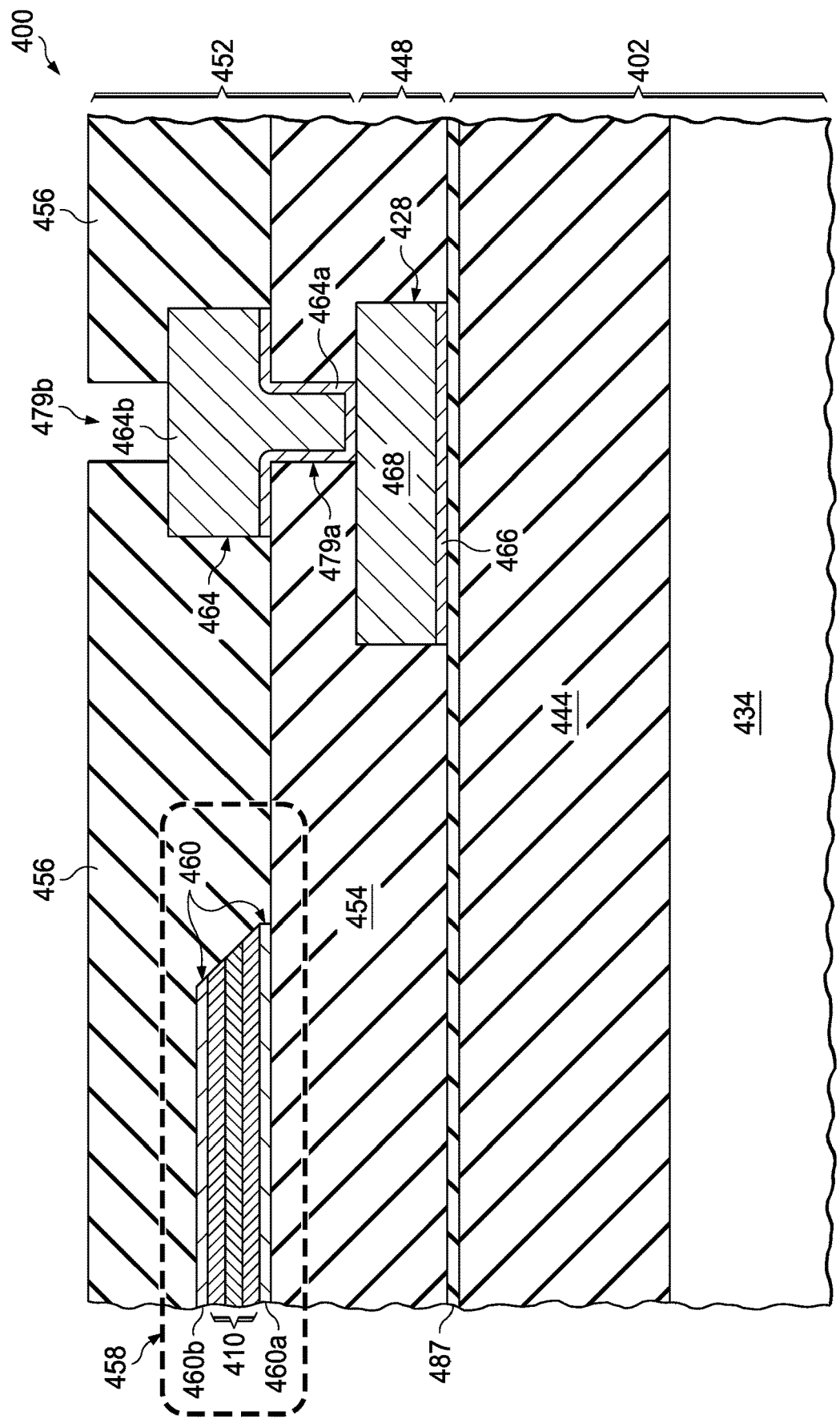

An upper isolation layer 456 of the isolation structure 452 is formed over the magnetic core 410. In the instant example, the upper isolation layer 456 may also comprise a photoimageable organic polymer, and may have a composition similar to the lower isolation layer 454. The upper isolation layer 456 may also be formed by a similar process as the lower isolation layer 454, including being exposed and developed to form upper portions of the winding vias, one of which is shown in FIG. 4I below. The upper isolation layer 456 may have a thickness of, for example, 500 nanometers to 5 microns over the magnetic core 410. 500 nanometers of the organic polymer is sufficient to provide isolation and stress control for a subsequently-formed magnetic core.

A stress control structure 458 comprises at least a portion of the lower isolation layer 454 and the upper isolation layer 456, proximate to the magnetic core 410. The stress control structure 458 may also comprise the lower layer 460a and the upper layer 460b of the adhesion/barrier structure 460. In the instant example, the stress control structure 458 provides a compliant structure which may enable expansion and contraction of the magnetic core 410 without generating structural defects in the magnetic material of the magnetic core 410, advantageously maintaining a low level of magnetic noise in the magnetic core 410.

Referring to FIG. 4I, which is a cross section across the magnetic core 410 and through the lower winding via 464, as shown in FIG. 4F and FIG. 4G, when the upper isolation layer 456 is exposed as described in reference to FIG. 4H, an upper via hole 479b is patterned in the photoimageable organic polymer of the upper isolation layer 456. When the upper isolation layer 456 is developed as described in reference to FIG. 4H, the upper via hole 479b is formed, exposing the lower winding via 464. A plurality of upper winding via holes are formed concurrently with the upper via hole 479b, each of which exposes a corresponding lower winding via. Alternatively, the upper isolation layer 456 may comprise a photo-insensitive organic polymer, as described in reference to FIG. 4F, with the upper via hole 479b being formed by another masked etch process.

Figure 4J:
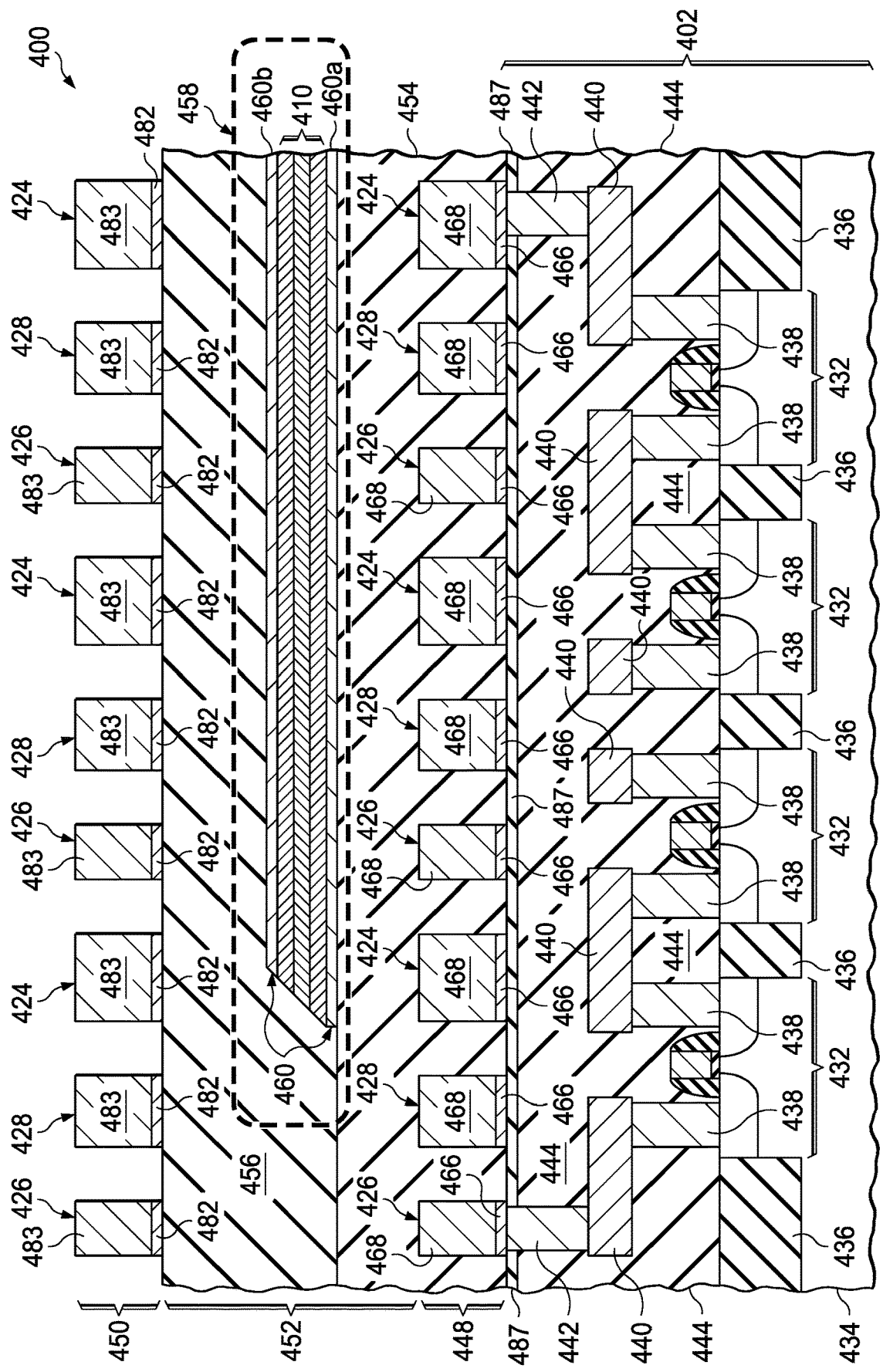

Referring to FIG. 4J, which is a cross section along the length of the core segment as shown in FIG. 4H, upper segments 450 of the excitation winding 424, the sense winding 426, and the compensation winding 428 are formed over the upper isolation layer 456 of the isolation structure 452. The upper segments 450 may be formed by a copper masked plating process, as described in reference to FIG. 4A through FIG. 4D, so that each upper segment 450 includes a plating seed layer 482 and a fill metal 483 of electroplated copper. The upper segments 450 may have a thickness similar to the lower segments 448. FIG. 4J shows the integrated fluxgate device 400 after a plating mask used to form the upper segments 450 has been removed.

Figure 4K:
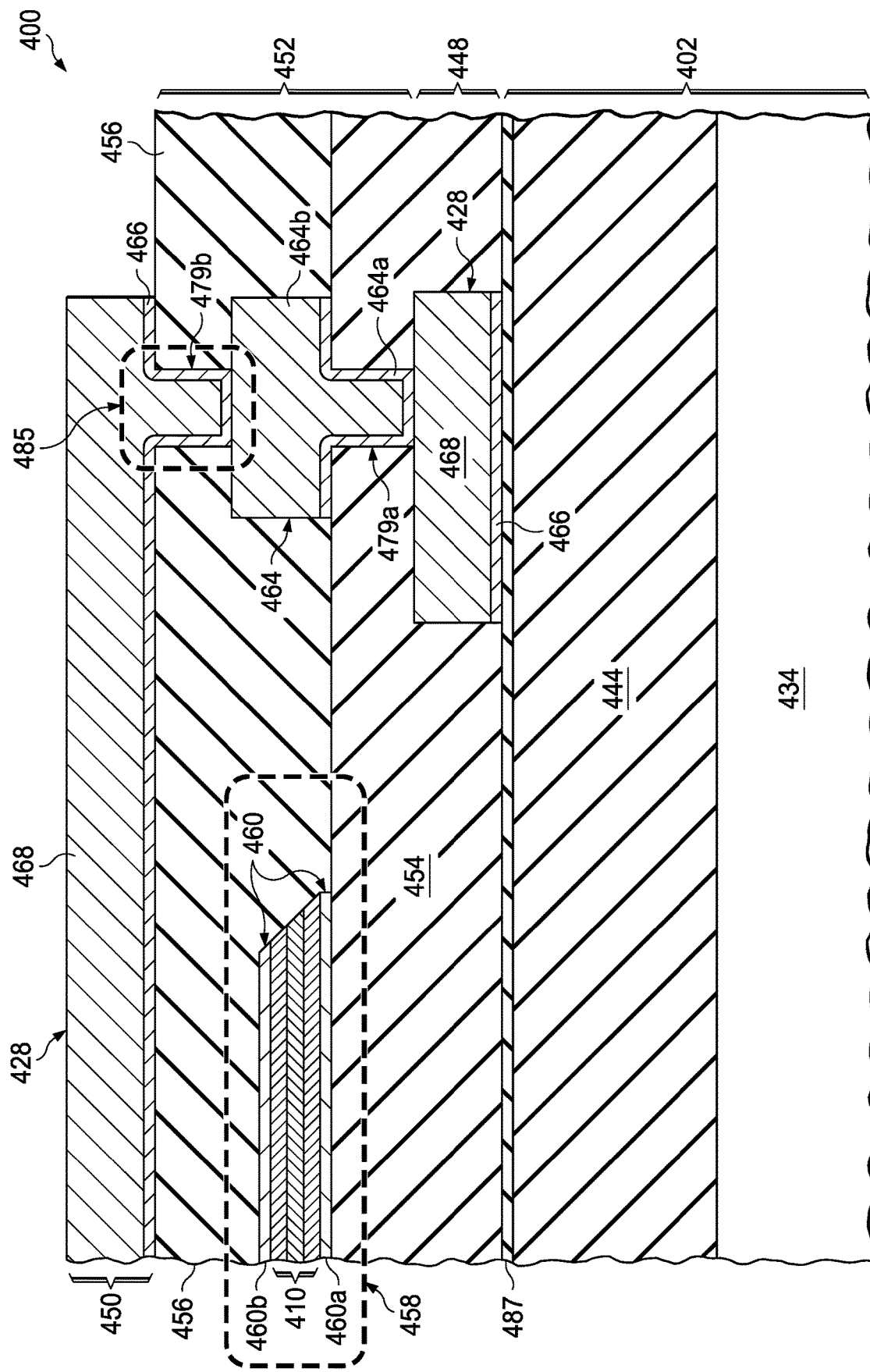

Referring to FIG. 4K, which is a cross section across the magnetic core 410 and through the lower winding via 464, as shown in FIG. 4I, the upper segment 450 of the compensation winding 428 extends into the upper via hole 479b, thus forming an upper winding via 485 which makes contact to the lower winding via 464. The plating seed layer 466 of the compensation winding 428 extends onto sidewalls of the upper via hole 479b and onto the lower winding via 464, as depicted in FIG. 4K. The copper fill metal 468 fills the upper via hole 479b on the plating seed layer 466. The plurality of upper via holes that were formed concurrently with the upper via hole 479b are similarly filled with the remaining upper segments 450 of the excitation winding 424, the sense winding 426, and the compensation winding 428, that are out of the plane of FIG. 4K to form corresponding upper winding vias. Thus, each of the upper segments 450 is coupled to a corresponding lower segment 448 through one of the upper winding vias and one of the lower winding vias.

Figure 4L:
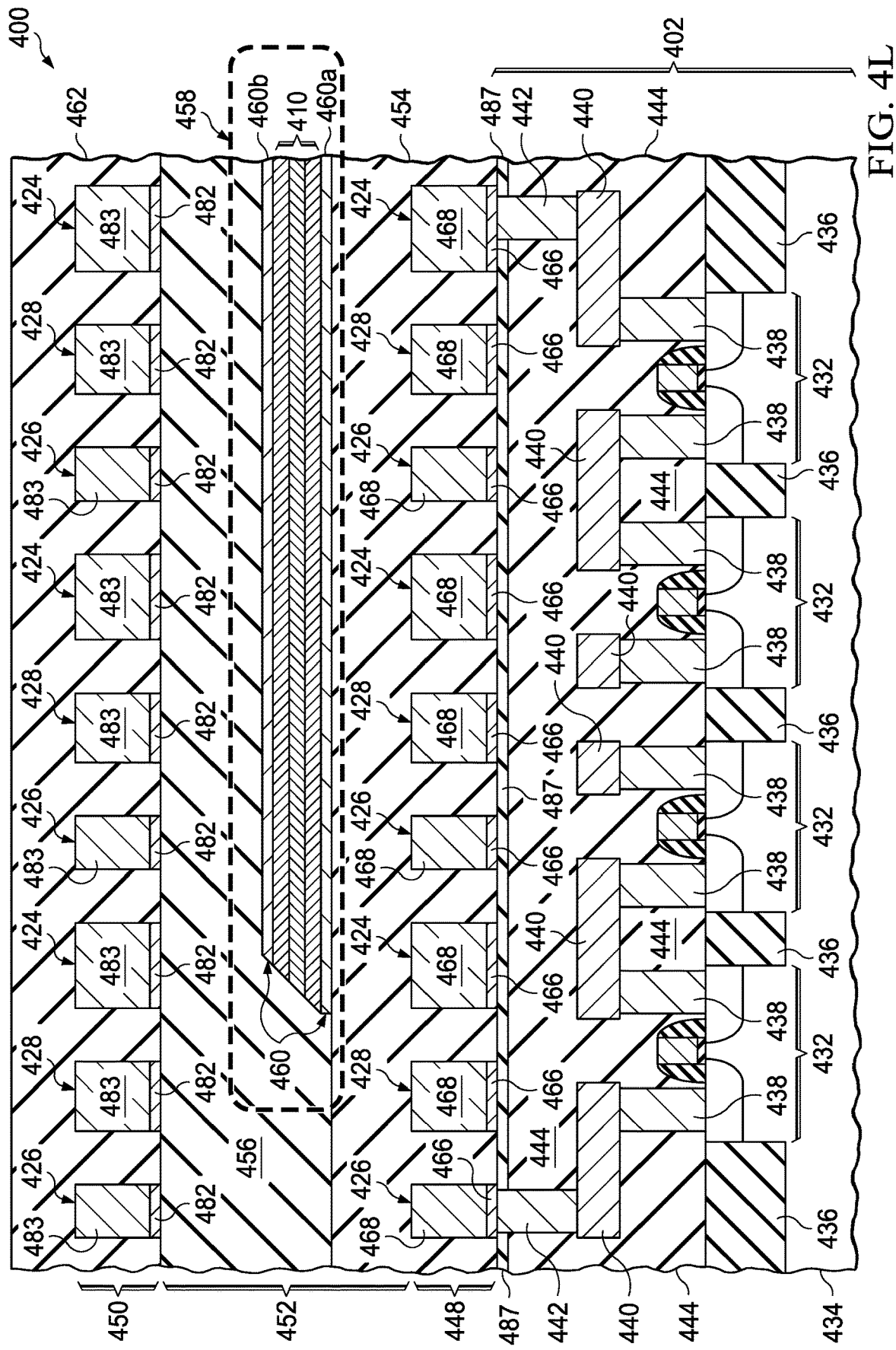

Referring to FIG. 4L, a top dielectric layer 462 is formed over the upper segments 450 of the upper segments 450 of the excitation winding 424, the sense winding 426, and the compensation winding 428. In the instant example, the top dielectric layer 462 may also comprise a photoimageable organic polymer, and may have a composition similar to the upper isolation layer 456. The top dielectric layer 462 may extend into spaces between the upper segments 450 and so provide lateral isolation for the upper segments 450. The top dielectric layer 462 may also be formed by a similar process as the upper isolation layer 456, including being exposed and developed to form opening for bond pads. The top dielectric layer 462 may have a thickness of, for example, 3 microns to 5 microns over the upper segments 450.

Figure 5A:
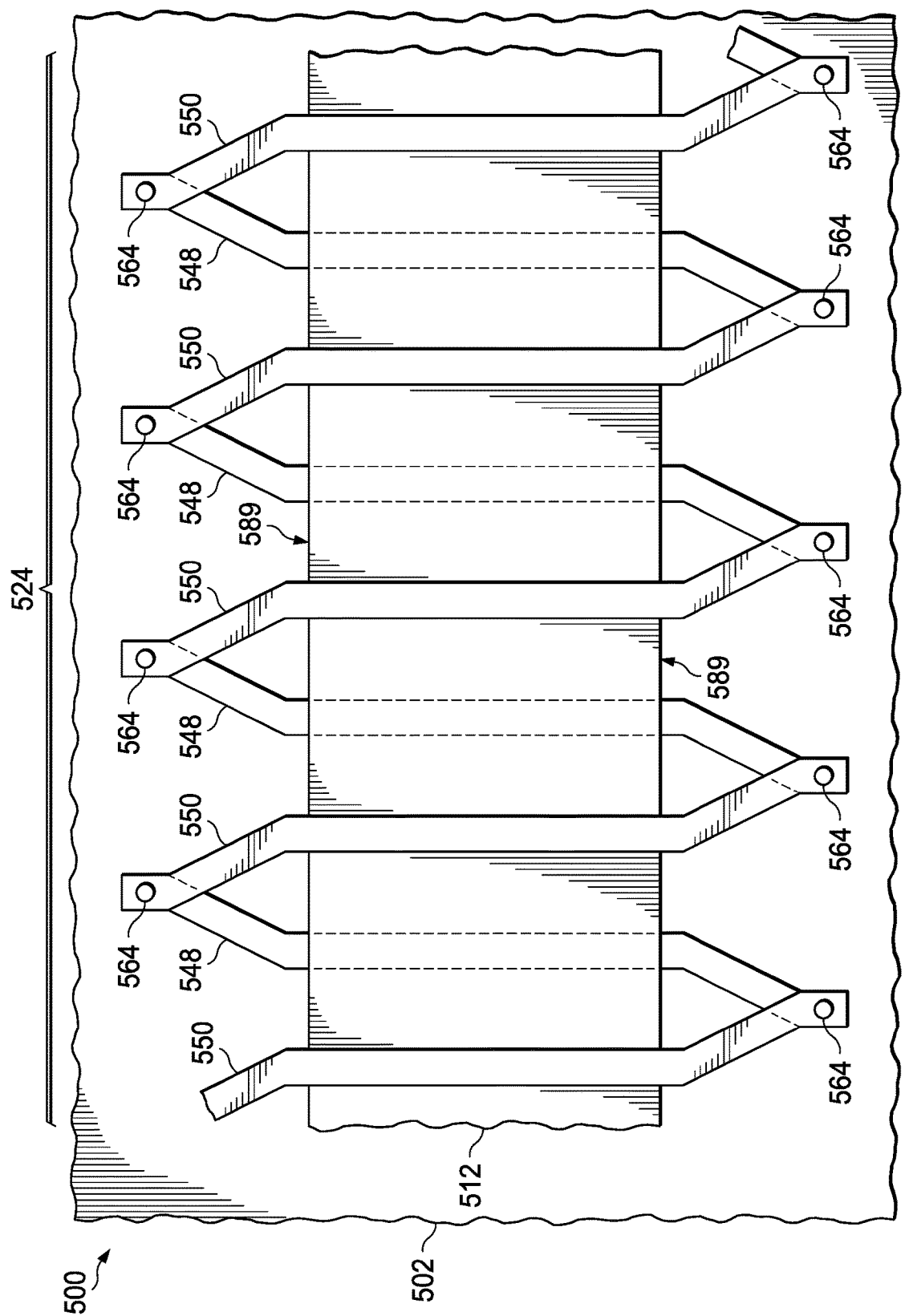
FIG. 5A and FIG. 5B are top views of another example integrated fluxgate device, depicting an alternate configuration for an excitation winding, a sense winding and a compensation winding.
Figure 5B:
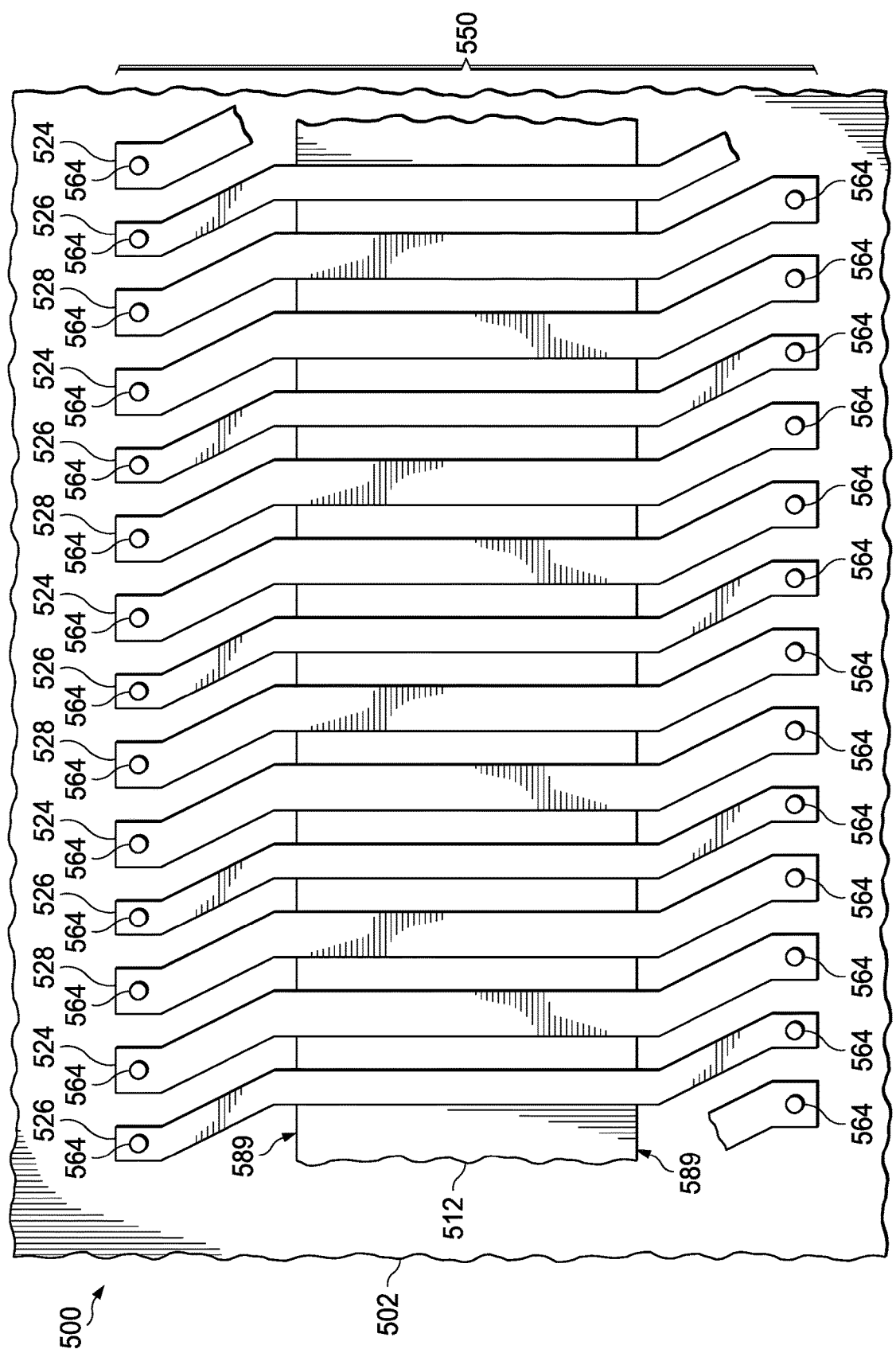

FIG. 5A and FIG. 5B are top views of another example integrated fluxgate device, depicting an alternate configuration for an excitation winding, a sense winding and a compensation winding. Referring to FIG. 5A, the integrated fluxgate device 500 includes a control circuit 502, for example as described in reference to FIG. 1A through FIG. 1C. A first core segment 512 of a magnetic core is disposed over the control circuit 502. An excitation winding 524, a sense winding and a compensation winding are coiled around the first core segment 512. The sense winding and the compensation winding are not shown in FIG. 5A, to more clearly show the coiled configuration of the excitation winding 524. Similarly, dielectric layers around the first core segment 512 are not shown in FIG. 5A to avoid obscuring the coiled configuration of the excitation winding 524. The excitation winding 524 includes lower segments 548 disposed under the first core segment 512 and upper segments 550 disposed over the first core segment 512. The lower segments 548 are coupled to the upper segments 550, for example through winding vias 564. In the instant example, portions of the upper segments 550 which are disposed directly over the first core segment 512 are perpendicular to lateral edges 589 of the first core segment 512. Similarly, portions of the lower segments 548 which are disposed directly under the first core segment 512 are perpendicular to the lateral edges 589 of the first core segment 512. The lower segments 548 have diagonal portions outside of the portions disposed directly under the first core segment 512, and the upper segments 550 have diagonal portions outside of the portions disposed directly over the first core segment 512, so as to intersect at the winding vias 564. Configuring the excitation winding 524 to be perpendicular to the lateral edges 589 of the first core segment 512 may advantageously configure the excitation winding 524 to provide a more uniform magnetic field in the first core segment 512 during operation of the integrated fluxgate device 500. The excitation winding 524 may have a similar perpendicular coil configuration around a second core segment of the magnetic core, accruing a similar advantage.

FIG. 5B is a top view of the integrated fluxgate device 500, showing upper segments 550 of the excitation winding 524, the sense winding 526, and the compensation winding 528 each having a similar perpendicular coil configuration over the first core segment 512. Lower segments of the excitation winding 524, the sense winding 526, and the compensation winding 528 also have a similar perpendicular coil configuration under the first core segment 512. Configuring the sense winding 526 to be perpendicular to the lateral edges 589 of the first core segment 512 may advantageously configure the sense winding 526 to provide a more accurate and linear output signal during operation of the integrated fluxgate device 500. Configuring the compensation winding 528 to be perpendicular to the lateral edges 589 of the first core segment 512 may configure the compensation winding 528 to provide a more uniform compensation magnetic field in the first core segment 512 during operation of the integrated fluxgate device 500, thereby advantageously enabling the integrated fluxgate device 500 to operate more closely to a desired operating point. The sense winding 526 and the compensation winding 528 may have a similar perpendicular coil configuration around the second core segment of the magnetic core, accruing similar advantages.

Figure 6:
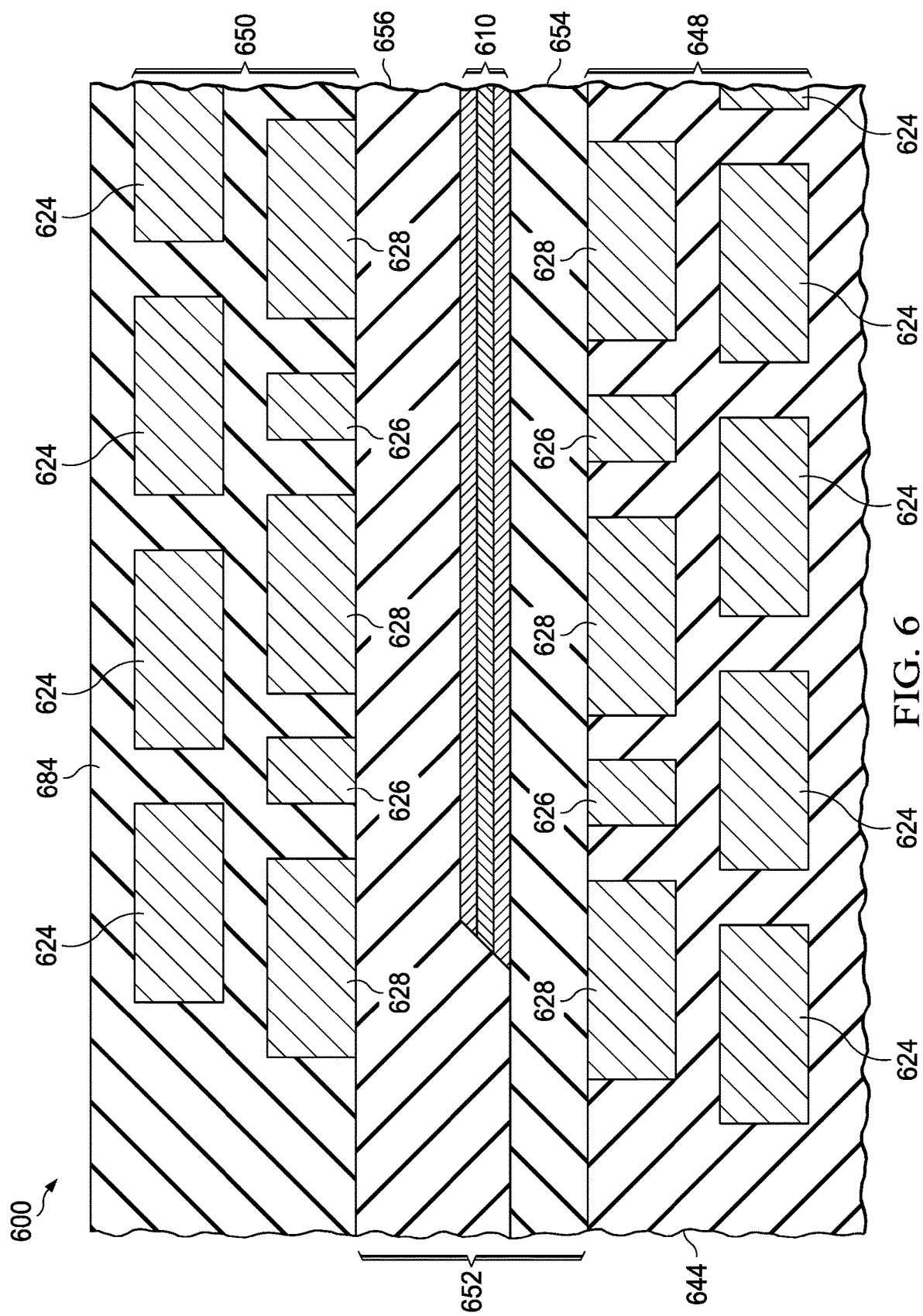
FIG. 6 is a cross section of a further example integrated fluxgate device.

FIG. 6 is a cross section of a further example integrated fluxgate device. The integrated fluxgate device 600 includes a magnetic core 610 disposed over a lower isolation layer 654 and under an upper isolation layer 656. The lower isolation layer 654 and the upper isolation layer 656 are parts of an isolation structure 652 which isolates the magnetic core 610 from lower segments 648 and upper segments 650 of an excitation winding 624, a sense winding 626 and a compensation winding 628. The lower isolation layer 654 and the upper isolation layer 656 may have, for example, any of the structures disclosed herein. The lower segments 648 may be disposed in a lower dielectric structure 644, which may include, for example, several sub-layers of dielectric material. The upper segments 650 may be disposed in an upper dielectric structure 684, which may also include several layers of dielectric material.

In the instant example, the lower segments 648 are disposed in more than one metallization level in the lower dielectric structure 644. For example, the lower segments 648 of the excitation winding 624 may be disposed in a first metallization level, and the lower segments 648 of the sense winding 626 and the compensation winding 628 may be disposed in a second metallization level, above the first metallization level, as depicted in FIG. 6. Similarly, in the instant example, the upper segments 650 are disposed in more than one metallization level in the upper dielectric structure 684. For example, the upper segments 650 of the excitation winding 624 may be disposed in a third metallization level, and the upper segments 650 of the sense winding 626 and the compensation winding 628 may be disposed in a fourth metallization level, below the third metallization level, as depicted in FIG. 6. The lower segments 648 and the upper segments 650 may have, for example, a copper damascene structure or a copper masked plated structure, as described herein. Alternatively, the lower segments 648 and the upper segments 650 may have another structure, such as an etched aluminum structure. In another version of the instant example, the upper segments 650 of both the excitation winding 624 and the compensation winding 628 may be disposed in more than one metallization level, and similarly for the lower segments 648 of both the excitation winding 624 and the compensation winding 628. Other configurations of the lower segments 648 and the upper segments 650 of the excitation winding 624, the sense winding 626, and the compensation winding 628 in multiple metallization levels are within the scope of the instant example.

Disposing the lower segments 648 in more than one metallization level may enable wider metal lines for the lower segments 648 thus reducing ohmic resistances of the excitation winding 624, the sense winding 626, and the compensation winding 628, advantageously reducing power consumption during operation of the integrated fluxgate device 600. Also, disposing the lower segments 648 in more than one metallization level may provide greater process latitude in forming the excitation winding 624, the sense winding 626, and the compensation winding 628, possibly including use of aluminum metallization. Further, disposing the lower segments 648 in more than one metallization level may enable a larger magnetic core 610, which may advantageously provide an improved resolution for the integrated fluxgate device 600. Disposing the upper segments 650 in more than one metallization level may accrue the same advantages.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated fluxgate device, comprising:
a magnetic core disposed over a semiconductor substrate;
a first winding disposed in a first metallization level above and a second metallization level below the magnetic core, the first winding configured to generate a first magnetic field in the magnetic core;
a second winding disposed in the first and second metallization levels and configured to generate a second magnetic field in the magnetic core;
a third winding disposed in the first and second metallization levels and configured to sense a net magnetic field in the magnetic core.

2. The integrated fluxgate device of claim 1, wherein the first winding is configured to generate the first magnetic field in a first direction, and the second winding is configured to generate the second magnetic field in a second opposite direction.

3. The integrated fluxgate device of claim 1, wherein the magnetic core is a first magnetic core, and the net magnetic field is a first net magnetic field, further comprising:
a second magnetic core disposed over the semiconductor substrate; a fourth winding disposed in the first and second metallization levels and configured to generate a third magnetic field in the second magnetic core in a second direction.

4. The integrated fluxgate device of claim 1, further comprising an excitation circuit configured to direct an excitation signal toward the first winding, a excitation current having a frequency of at least 100 kHz.

5. The integrated fluxgate device of claim 4, wherein the excitation circuit is configured to generate a saturation magnetic field in the magnetic core.

6. The integrated fluxgate device of claim 1, further comprising a stress control structure disposed above and below the magnetic core.

7. The integrated fluxgate device of claim 1, wherein the magnetic core is encapsulated by an upper layer of a titanium-containing metal, and by a lower layer of the titanium-containing metal.

8. The integrated fluxgate device of claim 7, wherein the lower layer of titanium-containing metal is located on a lower isolation layer with a dielectric constant of 3.9 or less, and an upper isolation layer with a dielectric constant of 3.9 or less is located on the upper layer of titanium-containing metal.

9. The integrated fluxgate device of claim 7, wherein the lower and upper isolation layers comprise silicon dioxide.

10. The integrated fluxgate device of claim 1, further comprising:
an excitation circuit formed in or over the semiconductor substrate and configured to direct an excitation signal toward the first winding to generate the first magnetic field in a first direction; and
a compensation circuit formed in or over the semiconductor substrate and configured to direct a compensation signal toward the second winding to generate the second magnetic field in a second direction, the second direction being opposite the first direction.

11. The integrated fluxgate device of claim 1, wherein the first, second and third windings each include a plurality of segments, each segment having a portion that crosses opposite edges of the magnetic core in a direction perpendicular to the edges.

12. A method of forming an integrated circuit, comprising:
forming a magnetic core over a semiconductor substrate;
forming a first winding in a first metallization level above and a second metallization level below the magnetic core, the first winding;
forming a second winding in the first and second metallization levels;
forming a third winding in the first and second metallization levels;
configuring the first winding to generate a first magnetic field in the magnetic core, and the second winding to generate a second magnetic field in the magnetic core;
configuring the third winding to sense a net magnetic field in the magnetic core.

13. The method of claim 12, further comprising configuring the first winding to generate the first magnetic field in a first direction, and configuring the second winding to generate the second magnetic field in a second opposite direction.

14. The method of claim 12, wherein the magnetic core is a first magnetic core, and the net magnetic field is a first net magnetic field, further comprising:
   forming a second magnetic core over the semiconductor substrate; forming a fourth winding disposed in the first and second metallization levels and configured to generate a third magnetic field in a second magnetic core in a second direction;
   forming a fifth winding in the first and second metallization levels and configured to generate a fourth magnetic field in the second magnetic core in a first direction; and
   forming a sixth winding in the first and second metallization levels and configured to sense a second net magnetic field in the second magnetic core.

15. The method of claim 12, further comprising connecting an excitation circuit to the first winding, the excitation circuit configured to direct an excitation signal toward the first winding, a excitation current having a frequency of at least 100 kHz.

16. The method of claim 15, wherein the excitation circuit is configured to generate a saturation magnetic field in the magnetic core.

17. The method of claim 12, further comprising forming a stress control structure above and below the magnetic core.

18. The method of claim 12, further comprising encapsulating the magnetic core is within a upper and lower layers of a titanium-containing metal.

19. The method of claim 18, wherein the lower layer of titanium-containing metal is located on a lower isolation layer with a dielectric constant of 3.9 or less, and an upper isolation layer with a dielectric constant of 3.9 or less is located on the upper layer of titanium-containing metal.

20. The method of claim 12, further comprising:
   forming an excitation circuit in or over the semiconductor substrate, the excitation circuit configured to direct an excitation signal toward the first winding to generate the first magnetic field in the first direction; and
   forming an compensation circuit in or over the semiconductor substrate, the compensation circuit configured to direct a compensation signal toward the second winding to generate the second magnetic field in the second direction, the second direction being opposite the first direction.

* * * * *